US006910200B1

(12) United States Patent
Aubel et al.

(10) Patent No.: US 6,910,200 B1
(45) Date of Patent: Jun. 21, 2005

(54) METHOD AND APPARATUS FOR ASSOCIATING SELECTED CIRCUIT INSTANCES AND FOR PERFORMING A GROUP OPERATION THEREON

(75) Inventors: Mark D. Aubel, Essex Jct., VT (US); Joseph P. Kerzman, New Brighton, MN (US); James M. Nead, Minneapolis, MN (US); James E. Rezek, Mounds View, MN (US)

(73) Assignee: Unisys Corporation, Blue Bell, PA (US)

( * ) Notice: Subject to any disclaimer, the term of this patent is extended or adjusted under 35 U.S.C. 154(b) by 1060 days.

(21) Appl. No.: 08/789,028

(22) Filed: Jan. 27, 1997

(51) Int. Cl.[7] ............................ G06F 17/50; G06F 9/45; G06F 9/455
(52) U.S. Cl. ..................... 716/9; 716/1; 716/8; 716/10; 716/11; 716/12; 716/13; 716/14; 703/13
(58) Field of Search ............................... 364/488, 489, 364/490; 716/1, 8–14; 703/13

(56) References Cited

U.S. PATENT DOCUMENTS

| | | | |
|---|---|---|---|
| 4,758,953 A | | 7/1988 | Morita et al. |
| 4,831,543 A | | 5/1989 | Mastellone |
| 4,896,272 A | * | 1/1990 | Kurosawa .................... 364/491 |
| 4,918,614 A | | 4/1990 | Modarres et al. |
| 4,922,432 A | * | 5/1990 | Kobayashi et al. ......... 364/490 |
| 5,050,091 A | | 9/1991 | Rubin |
| 5,164,908 A | | 11/1992 | Igarashi |
| 5,175,696 A | | 12/1992 | Hooper et al. |
| 5,191,542 A | * | 3/1993 | Murofushi ................... 364/491 |
| 5,222,029 A | | 6/1993 | Hooper et al. |
| 5,255,363 A | | 10/1993 | Seyler |
| 5,267,175 A | | 11/1993 | Hooper |
| 5,341,309 A | | 8/1994 | Kawata |
| 5,349,536 A | * | 9/1994 | Ashtaputre et al. ......... 364/491 |
| 5,349,659 A | | 9/1994 | Do et al. |
| 5,355,317 A | | 10/1994 | Talbott et al. |
| 5,357,440 A | | 10/1994 | Talbott et al. |
| 5,359,523 A | | 10/1994 | Talbott et al. |
| 5,359,537 A | | 10/1994 | Saucier et al. |
| 5,361,357 A | | 11/1994 | Kionka |
| 5,398,195 A | | 3/1995 | Kim |
| 5,406,497 A | | 4/1995 | Altheimer et al. |
| 5,416,721 A | | 5/1995 | Nishiyama et al. |
| 5,418,733 A | | 5/1995 | Kamijima |
| 5,418,954 A | | 5/1995 | Petrus |
| 5,440,720 A | | 8/1995 | Baisuck et al. |
| 5,481,473 A | * | 1/1996 | Kim et al. ..................... 716/5 |
| 5,483,461 A | | 1/1996 | Lee et al. |
| 5,485,396 A | | 1/1996 | Brasen et al. |
| 5,490,266 A | | 2/1996 | Sturges |
| 5,490,268 A | | 2/1996 | Matsunaga |
| 5,491,640 A | | 2/1996 | Sharma et al. |
| 5,493,508 A | | 2/1996 | Dangelo et al. |
| 5,508,939 A | * | 4/1996 | Kim et al. ................... 364/490 |
| 5,513,119 A | * | 4/1996 | Moore et al. .................. 716/8 |
| 5,757,658 A | * | 5/1998 | Rodman et al. ............. 364/491 |
| 5,838,583 A | * | 11/1998 | Varadarajan et al. ........... 716/9 |
| 5,956,257 A | * | 9/1999 | Ginetti et al. .................. 716/3 |

OTHER PUBLICATIONS

Tufte, "CML III Bipolar Standard Cell Library" Proceedings of the 1988 Bipolar Circuits and Technology Meeting, Minneapolis, Minnesota, Sep., 1988, pp. 180–182.

* cited by examiner

*Primary Examiner*—Hugh Jones
(74) *Attorney, Agent, or Firm*—Charles A. Johnson; Mark T. Starr; Nawrocki, Rooney & Sivertson, P.A.

(57) ABSTRACT

A method and apparatus for associating selected circuit instances, and for allowing a later group manipulation thereof. Prior to entering a database editor tool, selected instances may be associated with one another, and the association may be recorded in the circuit design database. The database editor tool may then read the circuit design database and identify the selected instances and the association therebetween. The associated instances may be called a group, or preferably a stack. The database editor tool may then perform a group operation on the instances associated with the stack.

26 Claims, 16 Drawing Sheets

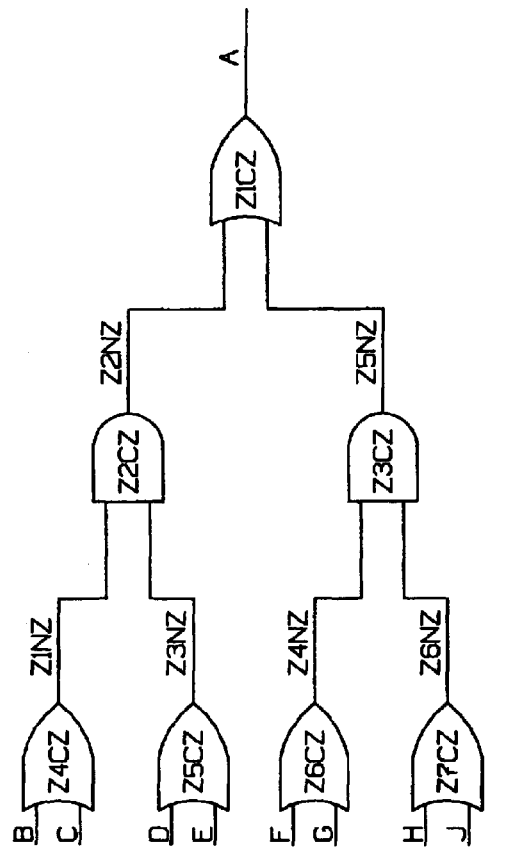
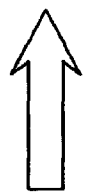
FIG. 10A
FIG. 10B

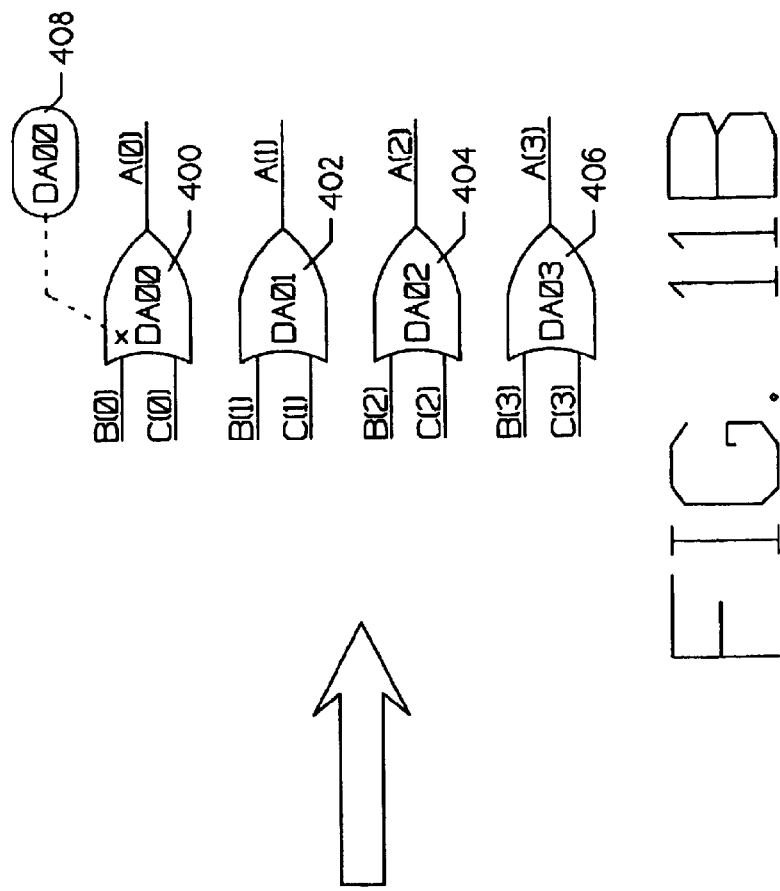

METHOD AND APPARATUS FOR ASSOCIATING SELECTED CIRCUIT INSTANCES AND FOR PERFORMING A GROUP OPERATION THEREON

CROSS REFERENCE TO CO-PENDING APPLICATIONS

The present application is related to U.S. patent application Ser. No. 08/789,025, filed Jan. 27, 1997, entitled "Method and Apparatus for Efficiently Viewing a Number of Selected Components Using a Database Editor Tool", U.S. patent application Ser. No. 08/789,026, filed Jan. 27, 1997, entitled "Method and Apparatus for Selecting Components Within a Circuit Design Database", U.S. patent application Ser. No. 08/789,027, filed Jan. 27, 1997, entitled "Method and Apparatus for Selectively Viewing Nets Within a Database Editor Tool", U.S. patent application Ser. No. 08/789,024, filed Jan. 27, 1997, entitled "Method and Apparatus for Identifying Physical Errors in a Placement Database", U.S. patent application Ser. No. 08/789,029, filed Jan. 27, 1997, entitled "Method and Apparatus for Using a Placement Tool to Manipulate Cell Substitution Lists", U.S. patent application Ser. No. 08/598,506, filed Feb. 7, 1996 entitled "Method and Apparatus for Performing Drive Strength Adjust Optimization in a Circuit Design", U.S. patent application Ser. No. 08/597,931, filed Feb. 7, 1996 entitled "Method and Apparatus for Resolving Conflicts Between Cell Substitution Recommendations Provided by a Drive Strength Adjust Tool", all of which are assigned to the assignee of the present invention and all of which are incorporated herein by reference.

BACKGROUND OF THE INVENTION

1. Field of the Invention

The present invention generally relates to a method and apparatus for manipulating a group of instances of a circuit design database, and more particularly relates to a method and apparatus for associating selected instances within the circuit design database, and for performing a group operation thereon.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

Another common method for specifying the integrated circuit design is the use a schematic capture tool. A schematic capture tool allows the circuit designer to directly enter the schematics for the circuit design. Unlike a hardware description language, the resulting schematics often completely specify the logical and functional relationships among the components of the design.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. Note that the hierarchy is typically structured as a special kind of a graph called a tree. This resulting data structure is called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Constituent parts of new gate-level logic created during each pass through the logic design synthesis software are given computer-generated component and net names. Each time the logic design synthesis software is executed for the integrated circuit design, the component and net names which are generated by the software, and not explicitly defined by the user, may change, depending on whether new logic has been added to or deleted from the integrated circuit design. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer may remove logic from the design that is unnecessary or otherwise improve the overall efficiency of the design. It is noted, however, that this action typically affects the component and net names generated by the logic synthesis tool.

It is also necessary to verify that the logic definition is correct and that the integrated circuit implements the function expected by the circuit designer. This verification is currently achieved by estimated timing and simulation software tools. The design undergoes design verification analysis in order to detect flaws in the design. The design is also analyzed by simulating a logic model of the design to assess the functionality of the design. If errors are found or the resulting functionality is unacceptable, the designer modifies the behavior description as needed. These design iterations help to ensure that the design satisfies its requirements. As a result of each revision to the design, the logic design synthesis-generated instance and net names may completely change. Further, the changes made by the logic optimizer may not be precisely known. Thus, the EDA tools downstream in the design process from the logic design synthesis software must be re-executed on the entire design.

After timing verification and functional simulation has been completed on the design, placement and routing of the design's components is performed. These steps involve assigning components of the design to locations on the integrated circuit chip and interconnecting the components to form nets. This may be accomplished using automated place and route tools.

Because automatic placement tools may not yield an optimal design solution, particularly for high performance designs that have strict timing and physical requirements, circuit designers often manually place critical circuit objects (e.g. cells or regions) within the boundary of the integrated circuit. This may be accomplished by using a placement directive tool (also known as a floorplanning tool), typically implemented in software. This floorplanning tool may include a graphical terminal that provides the circuit designer with visual information pertaining to the circuit design. This information is typically contained in several different windows.

A floor planning window may display a graphical representation of, for example, the die area of an integrated circuit, the placed objects and connectivity information. Similarly, a placed physical window may display the alphanumeric names of all placed cells and hierarchical regions. An un-placed physical window may display the alphanumeric names of all un-placed cells and hierarchical regions. A logic window may display a hierarchical tree graph of the circuit design.

During the placement process, the circuit designer may select the name of a desired object from the un-placed physical window displaying the un-placed objects. After this selection, the floorplanning tool may retrieve the physical representation of the selected object, and the circuit designer may use the cursor to position the physical representation of the selected object within the floor planning window. The floorplanning tool may then move the alphanumeric instance name of the selected object from the un-placed physical window to the placed physical window to indicate the placement thereof.

To edit the placement of desired objects, the circuit designer may select the desired representation of the object from the floor planning window using a pointing device. The circuit designer may, for example, draw a rectangle around the desired objects to affect the selection. After selection, the circuit designer may instruct the floorplanning tool to perform a desired editing function on the selected objects.

Some floorplanning tools allow the circuit designer to select a desired level of hierarchy or region as the current working environment, or "context". When the context is set, all of the objects existing at the next lower level in the circuit design hierarchy are displayed in one of the physical windows, thus making them available for placement or editing. These objects are called children objects of the selected context, and may include other hierarchical objects, including regions and/or cells. Thus, a context may include a mixture of regions and cells.

In this environment, circuit designers may perform preliminary placement by first placing selected regions. In some floorplanning tools, the outer boundary of the regions is appropriately sized to accommodate all underlying objects, even though all of the objects may not yet be placed. The circuit designer then may rely on an automated placement tool to subsequently place the underlying objects within the boundary of the region. If more detailed placement is required because of timing, physical or other constraints, selected lower level regions or cells may be manually placed by the circuit designer.

These prior art floorplanning tools suffer from a number of limitations, some of which are described below. First, while some floorplanning tools may allow some editing operations to be performed on user-defined groups of objects, the circuit designer typically must select the objects using a pointing device within the floorplanning window (for example, selecting all objects within a selected area in the floorplanning window). The prior art floorplanning tools typically do not allow groups of instances to be defined as a group prior to entering the floorplanning tool. This provides a major limitation since many group operations are performed on groups of objects that may not be readily identifiable by the circuit designer from within the floorplanning tool.

In addition, when a context is loaded in some prior art floorplanning tools, the children cells may appear as a pseudo random list of names in a physical window. Since large contexts often contain thousands of regions and/or cells, the physical window may provide little utility during the placement process. The circuit designer simply must scroll through the often lengthy list of instances in an attempt to identify the desired objects for placement. It is often more efficient for the circuit designer to determine an instance name by cross-referencing an external listing so that the name can be entered manually prior to placement.

Thus, to place a desired group of objects in a typical prior art floorplanning tool, the circuit designer must execute a series of time-consuming steps. For example, to place a series of buffers that drive a vectored bus, the circuit designer must typically find and select each instance name associated with each bit in the vectored bus from a physical window. In many cases, the instance names do not indicate a correspondence to the vectored bus, and thus the circuit designer must locate each instance separately, either by referring to an external listing or by scrolling through an often lengthy list of cells in the un-placed physical window. Finally, the circuit designer must sequentially place and align each instance relative to the previously placed instances. Largely because of this tedious process, circuit designers often decide to not perform manual placement, if at all possible.

SUMMARY OF THE INVENTION

The present invention overcomes many of the disadvantages of the prior art by providing a method and apparatus for associating selected circuit instances, and for allowing a later group manipulation thereof. In a preferred embodiment, the present invention contemplates associating selected instances prior to entering a database editor tool.

It is recognized that any database editor tool may be used or adapted to be used in accordance with the present invention. Some examples of database editor tools that may be used include schematic entry tools, place and route tools, simulation tools, floorplanning tools, or any other tool that allows the circuit designer to view and/or edit a representation of a circuit design. In a preferred embodiment, the database editor tool is a floorplanning tool.

Prior to entering a database editor tool, selected instances may be associated with one another, and the association may be recorded in the circuit design database. This association may be either manual or algorithmic by pattern recognition. The database editor tool may then read the circuit design database and identify the selected instances and the association therebetween. The associated instances may be called a group, or preferably a stack.

In an exemplary embodiment, the circuit design database may include a stack identifier that may identify the association of the selected instances with a selected stack. The database editor tool may then read the circuit design database and identify which of the instances are associated with each of a number of stacks. It is contemplated that the database editor may then perform a group operation on all or some of the instances associated with a selected stack. This may improve the efficiency and accuracy of manual manipulation of circuit instances, particularly since all of the cells associated with a particular stack may be manipulated at the same time.

In a preferred embodiment, the stacks are created during the design synthesis step, as discussed above in the BACKGROUND OF THE INVENTION. More specifically, it is contemplated that the stacks may be created when the logic equations are mapped to physical structures (instances). For illustration purposes, consider the vectored datapath. For those instances associated with a vectored data path, the physical structures (instances) may be assigned instance names that identify each instance as belonging to a corresponding stack. For example, for a 36 bit vectored bus driven by 36 buffers, the synthesis tool may assign a buffer to each bit of the vectored bus. In accordance with an illustrative embodiment of the present invention, the synthesis tool may be programmed to identify vectored nets (i.e. vectored logic equations), and treat the resulting 36 buffers as a stack. In the preferred embodiment, each buffer may be assigned an instance name with the same prefix (e.g. "DA"), but a different trailing bit number as a suffix. The database editor tool may recognize and group all instances having a common prefix. It is contemplated that the special stack status of the buffers may also be recorded in the circuit design database, preferably as a database object associated with each buffer instance.

As discussed above, to place a series of buffers that drive a vectored bus using a prior art placement tool, the circuit designer typically must sequentially find and select each instance name associated with each bit in the vectored bus from a physical window. In many cases, the instances names do not indicate a correspondence with the vectored bus, and thus the circuit designer typically must locate each instance separately, either by referring to an external listing or by scrolling through an often lengthy list of cells in the un-placed physical window. Finally, the circuit designer typically would sequentially place and align each instance relative to the previously placed instances. Largely because of this tedious process, circuit designers often decided not to perform manual placement, if at all possible.

In contrast, a floorplanning tool of the present invention may understand the stack identifiers provided in the circuit design database, and may provide an efficient way to manipulate and place the instances associated therewith. For example, any cell manipulation operation that can be used to move, place, edit, etc. a single cell, may also be used to manipulate all instances associated with a stack. That is, all instances associated with a stack may be placed, moved, unplaced, abutted, redrawn, aligned, connected, mirrored, etc., in a similar manner as a single cell may be manipulated.

In addition to the above and in accordance with the present invention, a circuit designer may also place all buffers of a vectored bus by simply executing a number of keystrokes. In a preferred embodiment, the circuit designer may identify a selected instance that is associated with a stack. This selection may not only select the selected instance, but may select all other subsequent instances associated with the corresponding stack (i.e. all instances having a suffix with a higher/lower bit number than the selected instance). The circuit designer may then specify a desired abutment spacing (spacing to be allotted between neighboring cells), and a placement location for the selected instance. Finally, the circuit designer may specify a placement direction (left, right, down, up, etc.) for subsequent cell placement. A single key-stroke may then cause the placement tool to automatically place, in a bit order fashion, all of the selected instances associated with the stack.

While this illustrates an exemplary method for placing a number of buffers associated with a vectored net, it is contemplated that other operations provided by a database editor tool may be similarly performed.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 10A illustrates a behavioral equation representation of selected logic from a circuit design;

FIG. 10B is a structural level description synthesized from the behavioral equation shown in FIG. 10A;

FIG. 11A illustrates a behavioral equation representation of an illustrative vectored data path;

FIG. 11B is a structural level description synthesized from the behavioral equation shown in FIG. 11A;

DETAILED DESCRIPTION OF THE PREFERRED EMBODIMENTS

Figure 1:
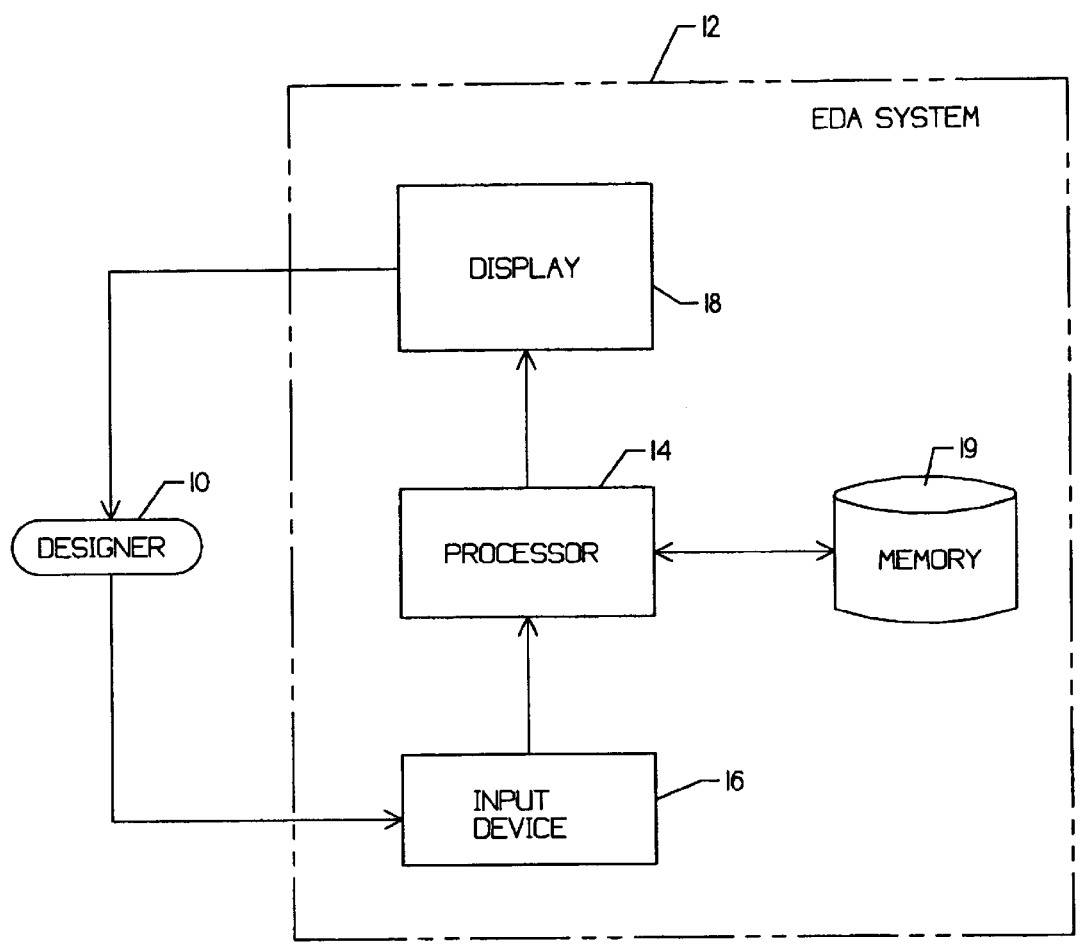
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

Integrated circuit designers describe the high-level logical representation of a design in terms of equations. This logical representation is called a "behavior" description. The behavior description is simulated and verified to assure that it conforms to the desired specifications. Once the behavior description of the integrated circuit has been verified, it is transformed into a detailed description (also known as a structural or gate-level description). This conversion process is called synthesis. The detailed description represents the equation-based behavior description in the form of gate-level objects (components) and the connections (nets) between the objects. The detailed description is used for the remaining design processes. The detailed description is used to simulate the design at the gate level, establish the initial physical component placement (floor plan), complete the final physical component placement and net interconnect routing, perform delay calculation and timing analysis, and generate test patterns for manufacturing verification. During these remaining design processes, there are various attribute types and attribute values attached to the detailed description. Some of these attributes are generated by the integrated circuit designer (via software tool or tools), while other attributes are generated by the EDA software system. Names of components and nets are one of the main software-generated attributes.

Physical attribute values, especially component placement and interconnect routing coordinates, are contingent upon a name-based design. In other words, each attribute and its value is associated with a given name and the object the name represents. For the physical floorplanning process, a pair of X,Y coordinates (i.e., the physical attribute and given values) are associated with each component in the design. This process is controlled by the designer, but with assistance from the EDA software. For the physical layout process, the X,Y coordinates (again, the physical attribute and given values) are also associated with a specific component and its interconnect (net). This process usually includes a manual and automated portion executed by the circuit designer and EDA software.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 19. The Memory may take the form of a semiconductor memory, magnetic disks, optical disks, magnetic tape or other mass storage device.

Figure 2:
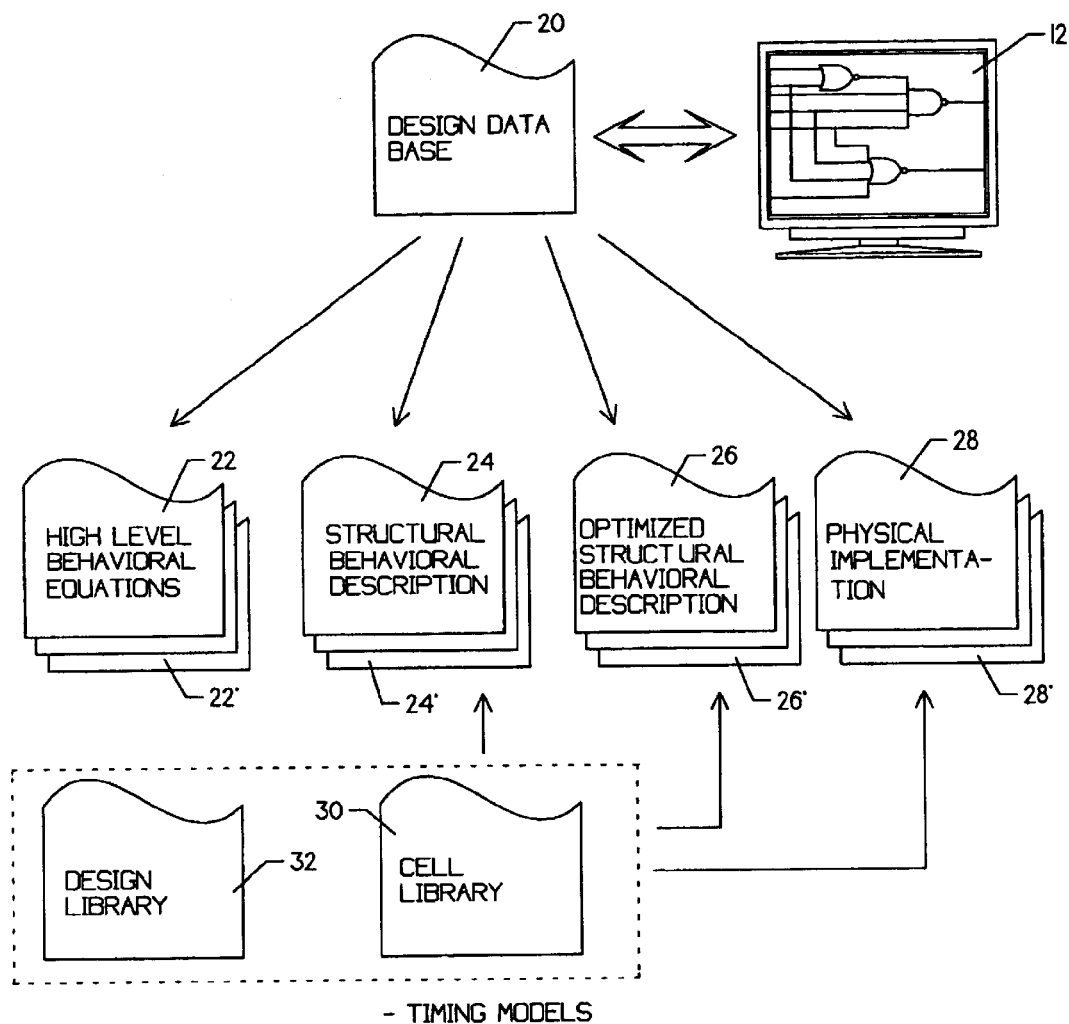
FIG. 2 is a block diagram showing typical circuit representations stored within a circuit design database.

FIG. 2 is a block diagram showing a number of circuit representations stored within a typical circuit design database. For example, the design database may include a high level behavioral representation 22, a structural behavioral description representation 24, an optimized structural behavioral representation 26, and a physical representation 28.

As indicated above, the circuit designer typically specifies the logic design of an integrated circuit by using design capture software that runs on an electronic design automation system 12. In the preferred embodiment, a cooperative of two systems including the Hardware Computer-Aided Design System (HCADS) and the Apollo Computer Aided Design System (ACADS), available from Unisys Corporation, are used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 map to functional components of the design. In the preferred embodiment, the high level behavior description representation 22 is written in a design language called Universal Design Source Language (UDSL), although other existing, well-known hardware design languages, such as verilog and VHDL, could also be used.

The high level behavior description representation 22 may be input to a logic design synthesis tool. The logic design synthesis tool may assign the gates, nets and other circuitry needed to implement the functions specified by the high level behavior description representation 22. In the preferred embodiment, the synthesis software comprises the Behavior to Structure Translator (BEST) synthesis tool developed by Unisys Corporation. However, alternate embodiments such as the Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural behavioral description representation 24, which is sometimes referred to as the net list for the design. This file contains the gate-level definition of the logic design. Preferably, the structural behavioral description representation 24 is in the Prime Behavior Description Language ('BDL), a format developed and used by the Unisys Corporation.

The structural behavioral description representation 24 may be provided to other EDA software programs, including an optimization program. The circuit optimization tool may read the structural behavioral description representation 24 and optimize the logic represented therein. Typically, the optimization tool may read and write Electronic Data Interchange Format (EDIF) files. The EDIF format is an industry standard format for hardware design language information. Thus, embedded within a typical optimization tool is an EDIF reader and an EDIF writer. The EDIF writer and reader translate the circuit design database 20 from an internal format to and from the EDIF format. It is recognized that the EDIF reader and EDIF writer programs may have to be provided by the user, depending on the format of the internal circuit design database.

The optimization methodology used by the optimization tool may be selectable by the user. For example, the user may direct the optimization tool to optimize a particular portion of the circuit design such that power, area, speed or other predefined parameter is optimized. Further, the optimization program may optimize the structural behavioral description representation 24 using components from a selected cell library 30 or design library 32. The optimization program may provide an optimized structural behavioral description representation, as shown at 26. In the preferred embodiment, the optimization program is the Design Compiler, commercially available from Synopsys, Inc.

The optimized structural behavioral description representation 26 may then be placed and routed using a commercially available place and route tool. In the preferred embodiment, the place and route tool, Gate Ensemble, provided by Cadence Design Systems, Inc. is utilized, although other firms active in the electronic design automation (EDA) industry sell systems similar in function to the above-mentioned Cadence tool.

The result may be stored in the circuit design database 20 as a physical implementation representation 28. As shown in FIG. 2, typical cell libraries include a number of representations of each component therein including a symbol representation, a schematic representation and a physical representation. This is also true for components in the design library 32. The physical implementation representation 28 of the circuit design database 20 typically includes references to the physical representation of the library components referenced therein.

Figure 3:
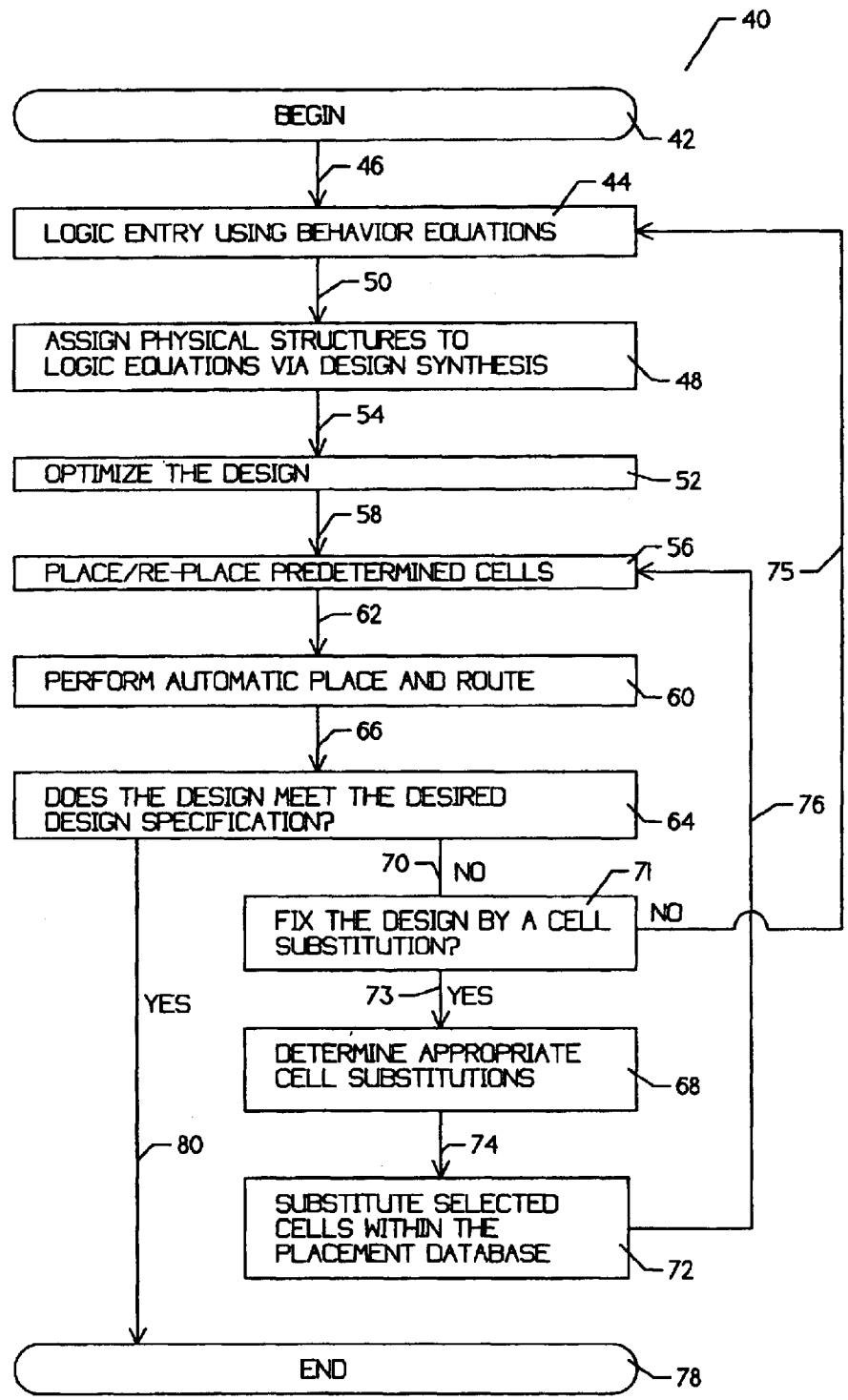
FIG. 3 is a flow diagram showing illustrative design steps in accordance with an exemplary embodiment of the present invention.

FIG. 3 is a flow diagram showing illustrative design steps in accordance with an exemplary embodiment of the present invention. The flow diagram is generally shown at 40 and is entered at element 42. Control is passed to element 44 via interface 46. Element 44 allows a circuit designer to enter the logic of a circuit design using behavioral equations. Control is then passed to element 48 via interface 50. Element 48 assigns physical structures to the logic equations via design synthesis. Control is then passed to element 52 via interface 54. Element 52 optimizes the circuit design. Control is then passed to element 56 via interface 58. Element 56 places predetermined cells within the circuit-design. In a preferred embodiment, this is performed by a circuit designer using a floorplan tool. Control is then passed to element 60 via interface 62. Element 60 automatically places and routes the remainder of the circuit design. Control is then passed to element 64 via interface 66. Element 64 determines whether the design meets the desired design specification.

If the design does not meet the desired design specification, control is passed to element 71 via interface 70. Element 71 determines whether the design can likely be corrected by a cell substitution. If the design can likely be corrected by a cell substitution, control is passed to element 68 via interface 73. Element 68 determines the appropriate cell substitutions. Control is then passed to element 72 via interface 74. Element 72 substitutes selected cells within the placement database. Control is then passed back to element 56 via interface 76, wherein predetermined cells are re-placed. Referring back to element 71, if the design cannot be corrected by a cell substitution, control is passed to element 44 via interface 75, wherein the logic equations are modified.

The loop comprising elements 56, 60, 64, 68 and 72, and potentially the loop comprising elements 44, 48, 52, 56, 60, 64 and 71, is repeated until the design meets the desired design specification. Once the design meets the desired design specification, control is passed from element 64 to element 78 via interface 80, wherein the algorithm is exited. It is recognized that the above-described design flow is only exemplary, and that variations thereof are contemplated.

Figure 4:
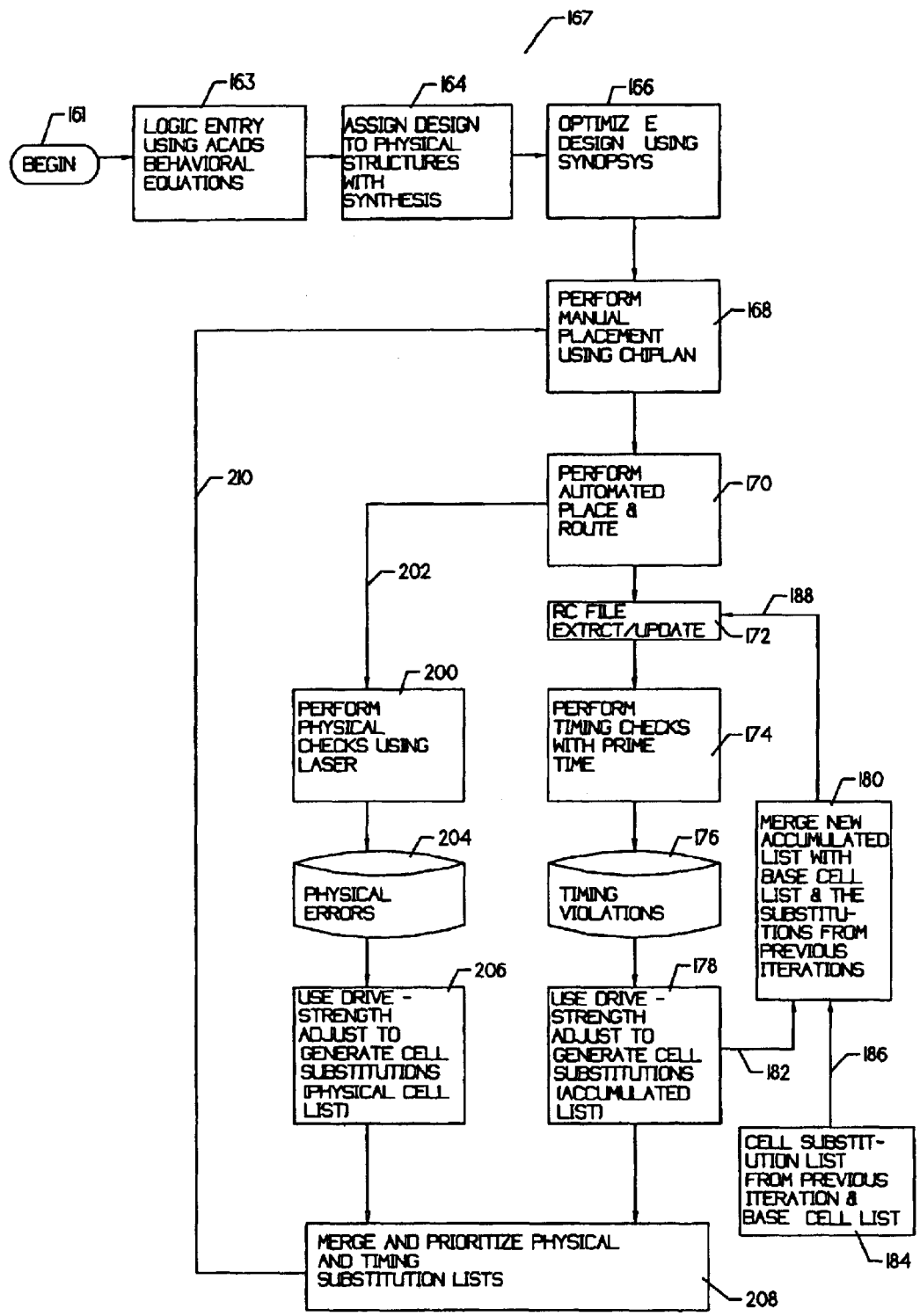
FIG. 4 is a flow diagram showing an illustrative design method in accordance with the present invention.

FIG. 4 is a flow diagram showing an illustrative design method in accordance with the present invention. The diagram is generally shown at 167. The method is entered at element 161. A logic designer typically enters logical equations describing the function of the design, as shown at 163. In the exemplary embodiment, logic entry is performed using HCADS Design Capture software available from the Unisys Corporation. A first synthesis tool 164 may then implement the logical equations using logical cells from a component library. A second synthesis tool 166 may then minimize the logic using known techniques, and may attempt to optimize the design based on a number of predetermined factors. For example, the designer may direct the synthesis tool to optimize the design for speed, power, or some other factor. In the exemplary embodiment, a widely known synthesis tool called Design Compiler available from SYNOPSYS is used. The output of the second synthesis tool may be a design netlist, and preferably in the EDIF format.

The resulting design netlist may then be provided to a manual placement tool as shown at 168. In some cases, it is advantageous to manually place data paths, as well as certain critical cells within the design. The manual placement of these cells is typically accomplished via a floor-planning tool. Stand alone floor-planning tools are available. However, many place and route tools have at least a limited floor-planning capability. After these cells are manually placed by the designer, the remaining cells may be automatically placed and routed by the place and route tool, as shown at 170.

After the place and route netlist is generated, the designer may use an extraction tool to extract an RC file therefrom as shown at 172. The extraction tool may process the place and route netlist and may determine the resistance, capacitance, or any other parameters selected by the designer, for each net in the design. For example, the extraction tool may determine the capacitance of a particular net by calculating the input load capacitance for each gate connected to the net, and may further determine the capacitance between a corresponding route and any other layer within the design, including the substrate. That is, the extraction tool may determine what layers the particular route overlaps, and may calculate the capacitance generated therebetween.

To provide accurate results, the extraction tool is often provided with technology specific parameters including oxide thicknesses between metal layers, the permittivity of each of the oxide layers, etc. These technology specific parameters are often stored in a technology file, which may be read by the extraction tool.

After the extraction tool provides an RC file for the design, the RC file and the original netlist may be provided to a timing analysis tool as shown at 174. The timing analysis tool processes the netlist and the RC file to determine the timing of predetermined circuit paths within the design. Part of the pre-processing performed by the timing analysis tool is to read the timing information from the component library for each of the cells used in the design. For example, the timing information stored in the component library may include parameters such as a base delay, and delay per unit of capacitance. The timing analysis tool may use the timing information, along with the RC file to determine the delay for each cell within the design. Thereafter, the timing analysis tool identifies predetermined timing paths within the design, and adds the delay for each of the cells to determine an overall path delay for each timing path. The timing analysis tool may then report all timing paths that have an overall path delay that falls outside of a predetermined timing specification. That is, the timing analysis tool may determine if any timing violations exist, and may store a record of the timing violations as shown at 176.

If the timing analysis tool identifies timing violations, the designer must evaluate each timing violation, and provide corrections to the design to overcome such timing violations. To mitigate any timing violations that may exist, a first drive strength adjust tool 178 may be provided to identify selected components along selected timing paths to substitute with a corresponding logically equivalent component having a different drive strength, at the expense of a potential increase in size. The first drive strength adjust tool 178 is further described in U.S. patent application Ser. No. 08/598,506, filed Feb. 7, 1996 entitled "Method and Apparatus for Performing Drive Strength Adjust Optimization in a Circuit Design", and U.S. patent application Ser. No. 08/597,931, filed Feb. 7, 1996 entitled "Method and Apparatus for Resolving Conflicts Between Cell Substitution Recommendations Provided by a Drive Strength Adjust Tool".

After selected cells have been identified for substitution by the first drive strength adjust tool 178, an accumulated cell substitution list is created. The accumulated cell substitution list identifies the cells that are to be substituted during the present design iteration. The accumulated cell substitution list may be provided to a first merging step 180 via interface 182. Further, a base cell substitution list 184 is provided to the first merging step 180 via interface 186. In the exemplary embodiment, the base cell substitution list 184 is updated each design iteration and thus contains a master list of all cell substitutions.

The first merging step 180 merges the accumulated cell substitution list with the base cell substitution list thereby resulting in an updated base cell substitution list.

It is contemplated that the first merging step 180 may resolve any conflict between the accumulated cell substitution list and the base cell substitution list. An example of when a conflict may arise is when a particular cell is identified in more than one timing path during different design iterations. That is, the base cell substitution list may identify a particular cell within a first timing path and may indicate that the particular cell is to be substituted with a logically equivalent cell having a first drive strength. The accumulated cell substitution list, and during the current design iteration, may also identify the same cell within a second timing path and may indicate that the particular cell is to be substituted with a logically equivalent cell having a second drive strength. It is contemplated that the first merging step 180 may resolve this and other conflicts. In a preferred embodiment, the conflict is resolved based upon a predetermined priority scheme. Further details of the preferred priority scheme may be found below.

The updated base cell substitution list may be provided to the extracting tool 172, wherein an updated RC file may be generated and provided to the timing analysis tool 174 for the next design iteration. The extraction tool 172 may process the original place and route netlist and the updated base cell substitution list and may determine the resistance, capacitance, or any other parameters selected by the designer, for each net in the design.

Unlike the prior art, it is recognized that it is not necessary to repeat the place and route step 170 during each design iteration. That is, it is recognized that the placement and routing of the design does not significantly change, particularly when only cell substitutions are made to the design database. Further, it is recognized that the behavioral equations need not be updated during each design iteration. Thus, the behavioral equations need not be synthesized during each of the subsequent design iterations. This may significantly reduce the design cycle time.

In the exemplary embodiment, the process of extracting an RC file, performing timing analysis, identifying cells for substitution, creating an accumulated cell substitution list, and merging the accumulated cell substitution list with the base cell substitution list may be repeated until the design falls within the design specification, or until a defined criteria has been reached.

In addition to the above, it is contemplated that the exemplary embodiment may perform physical checks on the circuit design as shown at 200. The physical checks step 200 may indicate any physical check violations therein, and the physical check violations may be stored as shown at 204.

If physical checks violations are detected, a second drive strength adjust tool 206 may be provided for selecting cells for substitution with a corresponding logically equivalent component having a different drive strength to mitigate such physical check violations. It is contemplated that the cells selected by the second drive strength adjust step 206 may be recorded in a physical checks substitution list as shown at 206.

After the above described timing violation design iterations are complete, and the design meets the predetermined timing specification, a second merging step 208 may merge the accumulated cell substitution list with the physical checks substitution list. It is contemplated that the second merging step 208 may resolve any conflict between the accumulated cell substitution list and the physical checks substitution list, as described above.

An example of when a conflict may arise during the second merging step 208 is when a particular cell is identified both by the first drive strength adjust tool 178 and the second drive strength adjust tool 206. That is, the accumulated cell substitution list may indicate that a particular cell is to be substituted with a logically equivalent cell having a first drive strength to correct a timing violation. The second drive strength adjust tool 206 may also identify the same cell and may indicate that the particular cell is to be substituted with a logically equivalent cell having a second drive strength to correct a physical checks violation. It is contemplated that these conflicts use a predetermined priority scheme, as described in U.S. patent application Ser. No. 08/597,931, entitled "Method and Apparatus for Resolving Conflicts Between Cell Substitution Recommendations Provided by a Drive Strength Adjust Tool", which has been incorporated herein by reference.

After all conflicts are resolved, the second merging step 208 may provide a final substitution list. In the exemplary embodiment, the final substitution list is provided to a floorplan tool 168 (e.g., Chiplan) via interface 210. The designer may then make the necessary modifications to the design database. Thereafter, the design database may be provided to the place and route tool, for final placement and routing. The exemplary method may then be exited (not shown), or the process may be repeated to verify that the design database meets the circuit design specification.

Figure 5:
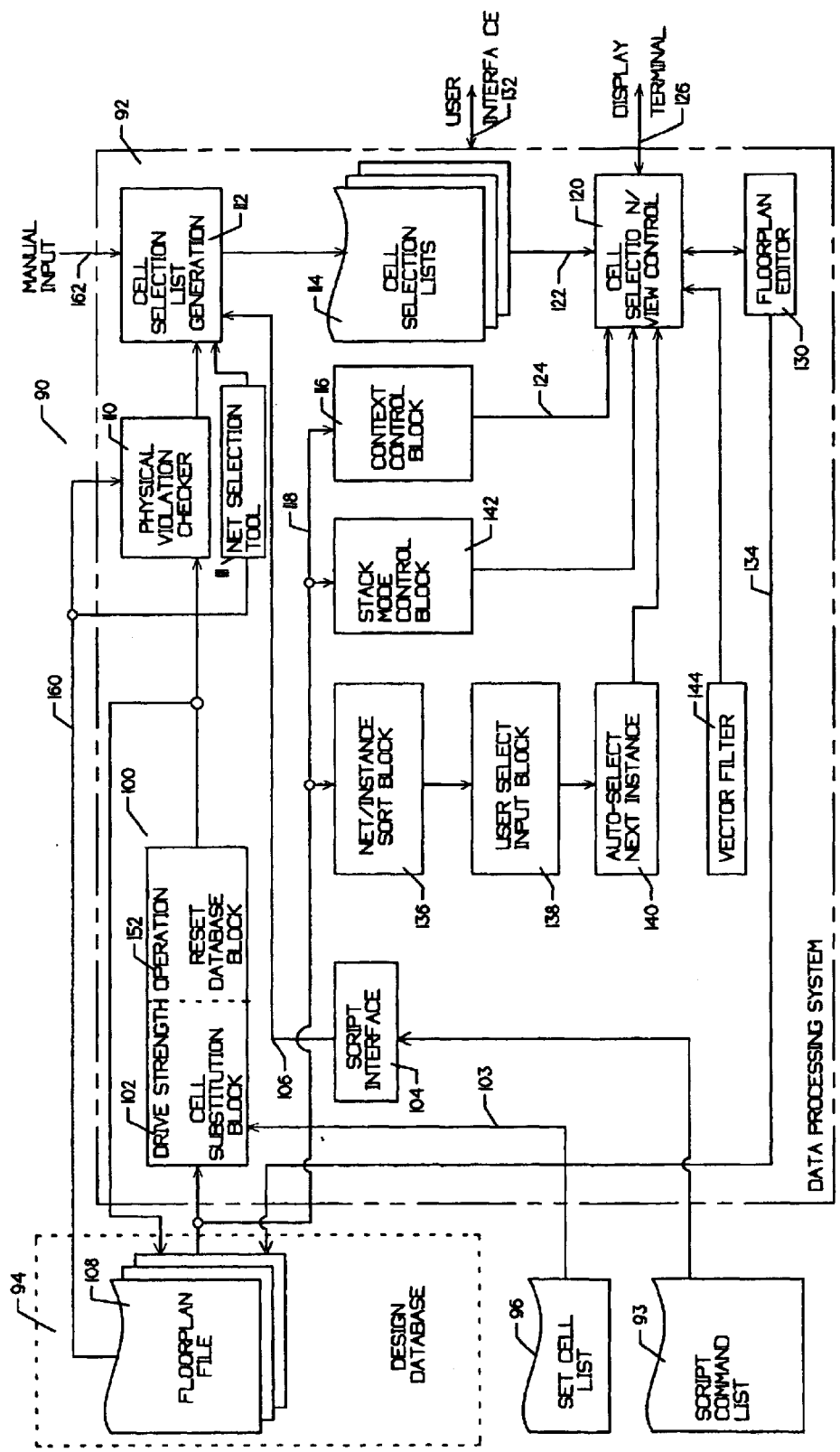
FIG. 5 is a block diagram of a first exemplary data processing system for affecting placement of a circuit design database, in accordance with the present invention.

FIG. 5 is a block diagram of a data processing system 92 for affecting placement of a circuit design in accordance with the present invention. The diagram is generally shown at 90. The data processing system 92 is coupled to a design database 94, a set cell list 96, and a script interface list 93. The design database 94 may include a floorplan file 108. The floorplan file 108 is part of the design database 94, and may include the information and data related to the floorplan, or placement, of the circuit design. In a preferred embodiment, the floorplan file is the only part of the design database 94 that is updated or changed during the floorplanning process.

The generation of the set cell list 96 is described in U.S. patent application Ser. No. 08/598,506, filed Feb. 7, 1996 entitled "Method and Apparatus for Performing Drive Strength Adjust Optimization in a Circuit Design" and U.S. patent application Ser. No. 08/597,931, filed Feb. 7, 1996 entitled "Method and Apparatus for Resolving Conflicts Between Cell Substitution Recommendations Provided by a Drive Strength Adjust Tool", both of which have been incorporated herein by reference. The set cell list 96 contains a list of desired cell substitutions.

The set cell list 96 may be provided to a drive strength operations block 100 via interface 103. Cell substitution block 102 may read the floorplan file 108, and may substitute the specified cells with predetermined cells having a different performance characteristic. In a preferred embodiment, the set cell list 96 identifies certain cells within the current floorplan file 108, and identifies a corresponding cell having a different drive strength for substitution.

After substitution, the cell substitution block 102 writes the results back to the floorplan file 108. A number of previous revisions of floorplan file 108 may be saved, as shown. The floorplan file 108 thus includes the cell substitutions provided by cell substitution block. Because the cell substitution block 102 may only replace the data object within the floorplan file 108, and may not modify the placement of adjacent cells, some of the replacement cells may, for example, overlap adjacent cells or otherwise violate predefined placement rules. This may be particularly true if the replacement cells are physically larger than the original cells. See, for example, U.S. patent application Ser. No. 08/598,506, filed Feb. 7, 1996 entitled "Method and Apparatus for Performing Drive Strength Adjust Optimization in a Circuit Design", and U.S. patent application Ser. No. 08/597,931, filed Feb. 7, 1996 entitled "Method and Apparatus for Resolving Conflicts Between Cell Substitution Recommendations Provided by a Drive Strength Adjust Tool".

To detect physical violations caused by the cell substitution block 102, the floorplan file 108 may be provided to a physical violations checker block 110. The physical violations checker block 110 may detect predetermined physical violations in the floorplan file 108. The physical violations checker 110 may provide the detected physical violations to a cell selection list generation block 112. The cell selection list generation block 112 may generate a list of cells that are involved in the detected physical violations. This may be controlled, at least in part, by script commands provided via interface 106. The resulting list of cells may be formatted into a cell selection list 114. It is contemplated that the cell selection list may also be provided by other input means including manual input interface 162, net selection list 111, or directly from the script interface 104 via interface 106.

In a preferred embodiment, the cell selection list 114 is a list of cells that are to be sequentially selected by the data processing system, thereby enabling a user to manually correct the detected physical violations. Thus, the cell selection list 114 may be provided to a cell selection/view control block 120. The cell selection/view control block 120 may sequentially select and display each of the cells in the cell selection list 114.

The cell selection/view control block 120 may be coupled to a display terminal via interface 126 and to a floor plan editor 130. The display terminal is used to display the current cell and surrounding cells. In a preferred embodiment, the cell selection/view control block 120 selects the current cell from the cell selection list 114, and zooms in and displays the current cell on the display device. Thereafter, the user may use the floorplan editor 130 via interface 132 to edit the floorplan file to correct the detected physical violation. After each of the cells identified in the cell selection list 114 has been sequentially operated upon by the cell selection/view control block, the user may direct the floorplan editor to store the floorplan file via interface 134. The above design process is also described in U.S. patent application Ser. No. 08/789,024, filed Jan. 27, 1997 entitled "Method and Apparatus for Identifying Physical Errors in a Placement Database" and U.S. patent application Ser. No. 08/789,025, filed Jan. 27, 1997, entitled "Method and Apparatus for Efficiently Viewing A Number of Selected Components Using a Database Editor Tool".

The above method is extremely valuable, particularly since large number of errors may be detected by the physical violations checker block 110. In the past, a circuit designer typically had to manually locate each violation by panning through the design in a floorplanning graphics window. Even when the exact location of a violation was known, navigating to that point could be slow, since the graphics terminal was often manipulating files containing tens of thousands of gates.

It is contemplated that the physical violations checker 110 may read the floorplan file 108 directly via interface 160. This may allow the physical violations checker 110 to detect violations in the floorplan file 108, without first performing a cell substitution. This may be particularly useful when the physical violations checker 110 can detect violations other than those caused by cell substitutions.

In some cases, a cell substitution may cause the performance of the design to decrease or otherwise not have the intended effect. Under these circumstances, it may be desirable to undo the cell substitutions made by cell substitution block 102, and revert back to a previous design iteration. A reset database block 152 may be provided to accomplish this task. The reset database block 152 may read the floorplan file 108, and may reset the floorplan file 108 back to a previous state. The set cell list 96 may then be exported and used by a drive strength adjust tool, as the basis for a new cell substitution. An exemplary drive strength adjust tool is discussed in U.S. patent application Ser. No. 08/598,506, filed on Feb. 7, 1996, and entitled "Method and Apparatus for Performing Drive Strength Adjust Optimization in a Circuit Design".

A number of features may be incorporated into the data processing system to aid in the placement of the design database 94. A context control block 116 may read the floorplan file 108 via interface 118, and may set the current context to a selected hierarchical level. A context is a level of hierarchy within the design database, and often corresponds to a region. The working environment of a corresponding floorplanning tool may be set to the current context. By setting the working environment in this manner, only those cells or regions at one level below the context are displayed in a physical window (for example, a physical window that displays all unplaced cells). This feature may allow a circuit designer to work on a selected portion of the design, without having to sift through the cells and regions that are outside of the current context.

In addition to the above, providing a context as the working environment may make the selection of cells or regions within the context easier, especially if two or more regions overlap. That is, in the present invention, the floorplanning tool may select only those cells and regions that are within the current context. Cells and interconnect outside the current context are still visible. This may be accomplished by enabling for selection only those cells that are associated with the selected context.

It has been recognized that the selection of a region within a floorplanning window can be difficult, particularly when one or more regions overlap. To overcome this limitation, the context control block 116 may include a feature for maneuvering through the circuit design hierarchy, selecting cells or regions, and setting the context accordingly. In a preferred embodiment, this is accomplished by using predetermined up and down hot-keys. This feature may allow a circuit designer to select a predetermined context by selecting a cell or region known to be in a predetermined context, and then hitting an up hot-key to select the predetermined context. This feature may also allow a circuit designer to set the current context to a context lower in the design hierarchy by hitting a down hot-key. Thus, the up and down hot-key feature may allow a circuit designer to easily change the current context to a different hierarchical level from within the floorplanning window.

In contrast to the above, and in prior art placement tools, changing and selecting contexts within the floorplanning window was tedious, especially if regions overlapped. That is, and as indicated above, prior art tools typically cycled through the various overlapping regions until the desired region was finally located by the circuit designer. This was often slow and tedious because the regions were often large, including thousands of gates, and the selection process could involve loading the context information into local memory.

It is contemplated that the data processing system 92 may further include a net/instance sort block 136, a user select block 138, and an auto-select next instance block 140. The net/instance sort block 136 may sort un-placed cells and regions by instance name, and display the results in a physical window. By sorting the un-placed cells in a predetermined way (e.g. by a corresponding net name or instance name), the circuit designer may more easily find a desired cell or region for placement.

In prior floorplanning tools, and as indicated above, when a context was loaded, all of the children cells appeared as a pseudo random list of names in a physical window. Since large contexts often contain thousands of instance names, the physical window provided little utility during the placement process. The circuit designer simply had to scroll through the often lengthy list of instances in an attempt to identify the desired object. It was often more efficient for the circuit designer to determine an instance name by cross-referencing an external listing so that the name could be entered manually prior to placement.

A further advantage of the net/instance sort block 136 is that a circuit designer may more easily define object groups, thereby allowing user defined group operations to more readily be performed. For example, a circuit designer may place all drivers for a vectored net by first performing a net sort, and then placing the first component in the group and specifying a direction for further group placement. The floorplanning tool may then incorporate features that allow the circuit designer to place all remaining cells in the group automatically. In the past, this simple operation could require the circuit designer to manually find each instance name, either from some external printout or by panning through the unsorted list within a physical window, and individually place each object.

The user select input block 138 allows a circuit designer to select a desired cell or region from the sorted list of cells provided by net/instance sort block 136. Auto-select next instance block 140 automatically selects the next cell or region in the sorted list of cells, thus allowing the user to sequentially place the cells or regions one after another. It is recognized that this may be particularly useful for placing cells that drive or receive vectored nets.

The data processing system 92 may further include a stack mode control block 142. The stack mode control block 142 may read the design database 94 and detect which groups of cells or regions have been defined as a stack. In a preferred embodiment, the design database 94 includes information which identifies selected cells as belonging to a particular stack. Once the stacks are identified, the stack mode control block 142 may allow the user to perform group operations on all instances associated with the stack. For example, all cells in the stack may be moved by simply moving the stack. Further, all cells in the stack may be placed by placing a first one of the cells and indicating a placement direction and spacing for the remaining cells of the stack. The stack mode control block 142 may automatically place the remaining cells in the specified direction and at the specified spacing.

Finally, data processing system 92 may include a vector filter block 144. Vectored filter block 144 may be coupled to the cell selection/view control block 120. Vector filter block 144 may allow a user to view only those vectored nets that are wider than a predetermined threshold, narrower than a predetermined threshold, or fall within a predetermined range. This may reduce the visual complexity of the circuit design on the display device, and may allow the circuit designer to more effectively analyze vectored net paths. A further discussion of the vector filter 144 can be found in U.S. patent application Ser. No. 08/189,027, filed Jan. 27, 1997, entitled "Method and Apparatus for Selectively Viewing Nets Within a Database Editor Tool".

Figure 6:
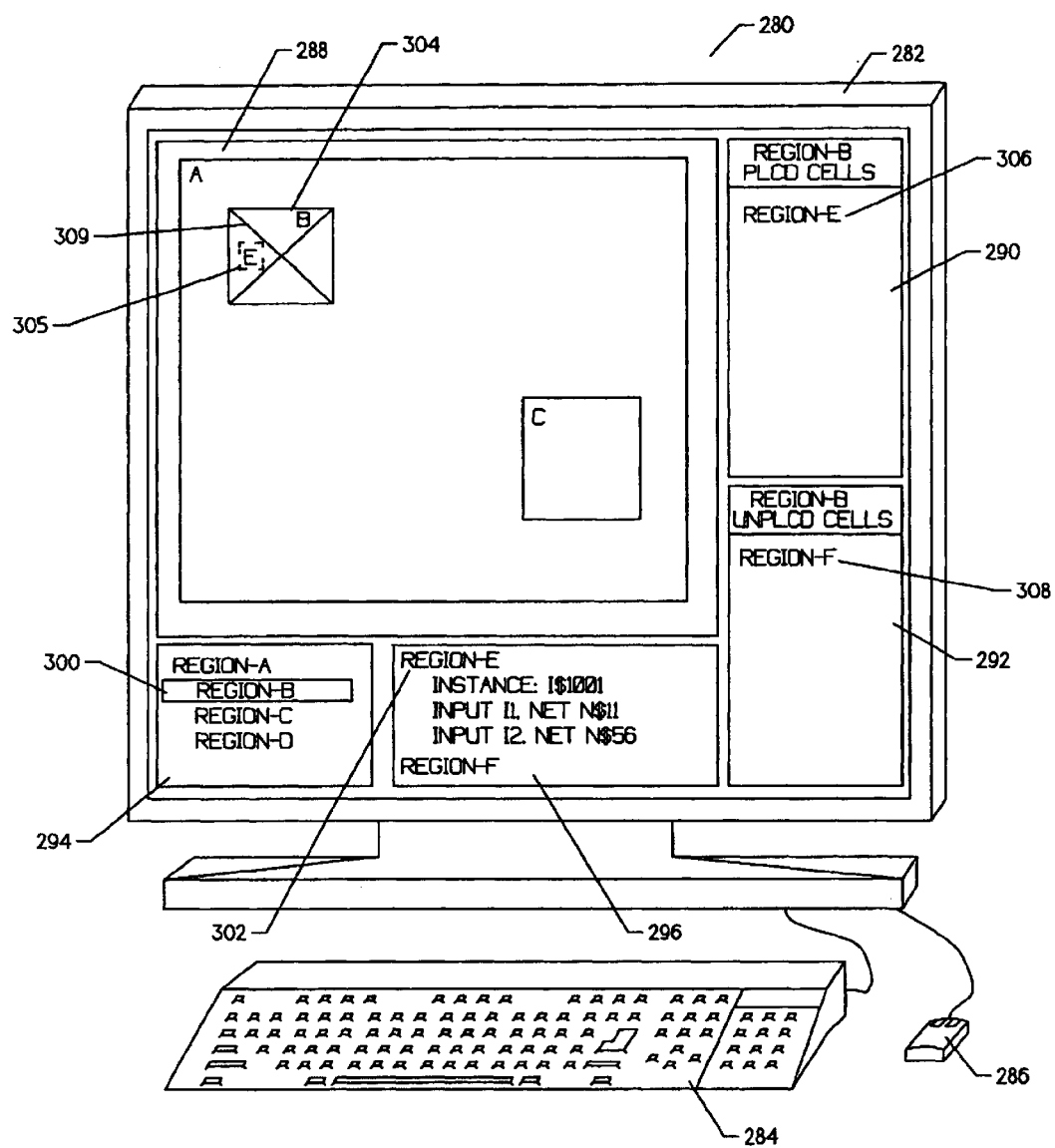
FIG. 6 is a block diagram of a data processing system executing a placement tool in accordance with the present invention.

FIG. 6 is a block diagram of a data processing system executing a placement tool in accordance with the present invention. In a preferred embodiment, the data processing system 280 may include a display device 282, a keyboard 284 and a pointing device 286. A microprocessor or the like may be included in the display device 282 or in a separate unit (not shown).

The data processing system 280 may incorporate a placement tool. The placement tool may be implemented in either hardware or software. In a preferred embodiment, the placement tool is implemented in software and executed on the data processing system 280.

The placement tool may display a number of windows on the display device 282. In the example shown, these windows including a floor planning window 288, two logical windows 294 and 296, and two physical windows 290 and 292. The floor planning window displays a physical representation of the circuit design database, and in particular, displays those cells and/or regions that are placed on a scaled representation of an integrated circuit die.

A first logic window 294 may display a tree graph of the circuit design hierarchy. The circuit designer may scroll through the first logic window 294, and may identify particular regions therefrom. In the illustrative diagram, region-B has been identified, as shown at 300. In a preferred embodiment, only regions are displayed in the first logic window 294. Leaf cells are not displayed.

A second logic window 296 may display the leaf cells or regions within the region that is identified in the first logic window 294. For example, if region-B is identified in the first logic window 294 as shown at 300, the second logic window 296 may display the cells within region-B. In this case, the second logic window 296 displays region-E and region-F, as shown at 302. It is assumed for this example, that region-E and region-F are leaf cells, otherwise they would be displayed in the first logic window 294.

It is contemplated that the second logic window 296 may also display selected database objects for each of the cells or regions therein. Accordingly, the second logic window 296 may display the instance name, the input pin names along with the associated net names for each input pin, the output pin names along with the associated net names for each output pin name, etc. It is contemplated that any number of predefined database objects may be displayed for each of the cells within the circuit design.

The placement tool may allow the circuit designer to set the current context in any number of ways. A first method is to identify a region or cell in the first logic window 294 or the second logic window 296, and hit a predefined set context key. For example, the circuit designer may identify region-B in the first logical window 294, as shown at 300. The designer may then hit the predefined set context key to set the current context to region-B. When a region is set as the current context, the placement tool may provide an "X" over the selected region in the floorplanning window 288, if placed, as shown at 309. This provides a visual indication of the current context. Further, the physical windows 290 and 292 may indicate the current context in the title bar thereof, as shown.

Another method for selecting a current context is to select a region in the floorplanning window, and then hit the predefined set context key. Yet another method is to select a region or cell from one of the physical windows (see below), and hit the predefined set context key. In general, after any cell or region is selected or identified in any manner, the circuit designer may set the current context to the selected cell or region by hitting the predefined set context key. It is recognized that the above-described methods for setting the current context are only exemplary, and that many other methods are contemplated.

A first physical window 292 may display all unplaced cells within the current context. Similarly, a second physical window 290 may display all placed cells within the current context. In a preferred embodiment, the current name of the region or cell that is set as the current context is displayed in the title bar of each of the first and second physical windows. In the illustrative embodiment, region-B is set as the current context, and thus the title bar above the first and second physical windows displays the name "region-B", as shown.

The floor planning window 288 displays a number of placed cells. In the present example, region-A, region-B, region-C, and region-E are displayed. As indicated above, region-B is selected as the current context. Thus, the second logic window displays the cells therein, including leaf cells region-E 302 and regions-F (partially shown), and selected database objects therefor.

Region-E is also displayed in the second physical window 290, as shown at 306, because region-E is already placed in the floor planning window 288, as shown at 305. Region-F, on the other hand, is displayed in the first physical window 292, as shown at 308, because region-F remains unplaced in the floor planning window 288.

During the placement of a circuit design database, the circuit designer may scroll through the first physical window 292 and set a selected region or cell as the current context (by hitting the predefined set context key). Once selected, the children of the selected region may be displayed in the first and second physical windows 290 and 292. The children of the selected region are referred to as the active regions and cells within the current context. The placed active regions and cells are displayed in the second physical window 290 and the un-placed active regions and cells are displayed in the first physical window 292. The circuit designer may then select an un-placed region or cell from the first physical window 292. The placement tool may then load a physical representation of the selected region or cell, and the circuit designer may place the physical representation of the region or cell in the floor planning window 288. The placement tool may then move the region or cell from the first physical window 292 to the second physical window 290. The first and second logic windows 294 and 296 are updated when the selection is changed in the floorplanning window 288, the first physical window 292 or the second physical window 290.

It is recognized that the circuit design database may be much more complex and contain many more levels of is hierarchy than is shown in the simple example. In a typical circuit design database, large contexts often contain thousands of regions and/or cells, and thus the first and second physical windows typically display many more objects.

Figure 7:
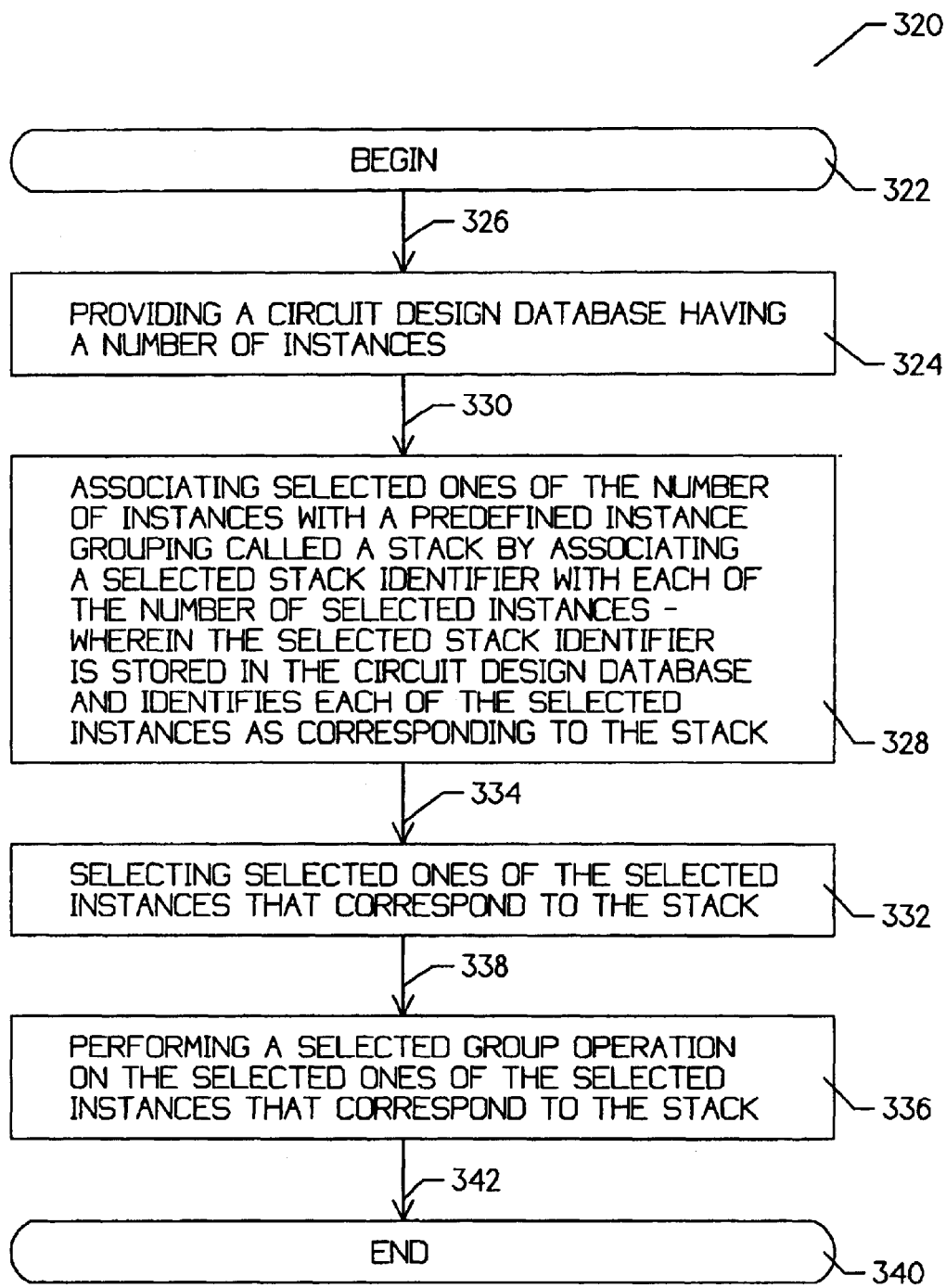
FIG. 7 is a flow diagram of an exemplary method of the present invention.

FIG. 7 is a flow diagram of an exemplary method of the present invention. The algorithm is generally shown at 320, and is entered at element 322. Control is passed to element 324 via interface 326. Element 324 provides a circuit design database having a number of instances therein. Control is then passed to element 328 via interface 330. Element 328 associates selected ones of the number of instances with a predefined instance grouping called a stack. This may be accomplished by associating a selected stack identifier with each of the number of selected instances. The selected stack identifier may be stored in the circuit design database, and may identify each of the selected instances as corresponding to the stack. Control is then passed to element 332 via interface 334. Element 332 selects selected ones of the selected instances that correspond to the stack. Control is then passed to element 336 via interface 338. Element 336 performs a selected group operation on the selected ones of the selected instances that correspond to the stack. Control is then passed to element 340 via interface 342, wherein the algorithm is exited.

Figure 8:
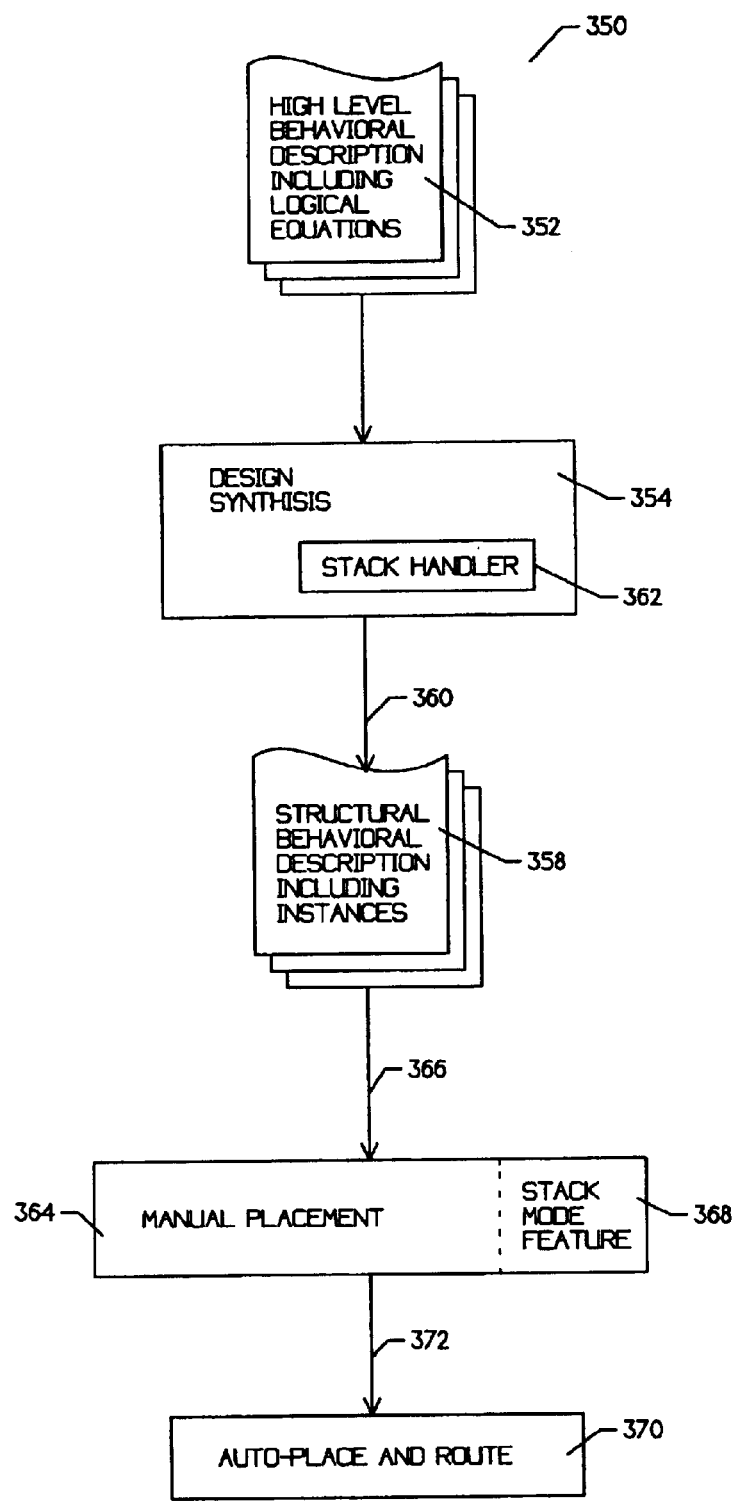
FIG. 8 is a block diagram showing an exemplary embodiment of the present invention.

FIG. 8 is a block diagram showing an exemplary embodiment of the present invention. The diagram is generally shown at 350. A high level behavioral description 352 of a circuit design may be provided to a design synthesis block 354, as shown. The design synthesis block 354 may generate a gate-level description of the functions or logic equations expressed in the high level behavioral description 352. Typically, each instance and net that are not explicitly defined by the circuit designer in the high level behavioral description 352 are given computer-generated component and net names. Further, each time the logic design synthesis software is executed for the integrated circuit design, the component and net names which are generated by the design synthesis tool 354 may change, depending on whether new logic has been added to or deleted from the integrated circuit design, or whether synthesis parameters have been changed. Typically, the logic design synthesis software is executed many times during the integrated circuit design process, because errors may be detected during the simulation and testing phases of the design cycle and then fixed in the behavioral description. The output of the design synthesis block 354 may be a structural behavioral description 358 which completely specifies the logical and functional relationships among the components of the design.

In accordance with an exemplary embodiment of the present invention, the design synthesis block may include a stack handler block 362. The stack handler block 362 may identify those instances that are part of a group, and may indicate an association therebetween. For example, the stack handler block 362 may identify all instances that are part of a vectored datapath. In one embodiment, this may be accomplished by analyzing the logic equations in the high level behavioral description 352, and identify all equations that include a bit width therein (e.g. (0–3)). When the corresponding logic is generated by the design synthesis block 354, the stack handler may tag those instances as belonging to a stack. The association between the instances and the stacks may be stored in the structural behavioral description 358.

In a preferred embodiment, the stack handler may indicate the association between instances by using a predefined instance name format. That is, the stack handler 362 may provide an instance name that indicates the association. The stack handler 362 may provide a common prefix (e.g. DA) for each instance name associated with a particular stack. In addition, the stack handler 362 may provide an appropriate suffix for each instance name, wherein the suffix may indicate the bit position of each instance within the vectored datapath. As described below, the placement block 364, by using the stack mode feature 368, may identify those instances that are associated with a stack by examining the instance names provided by the stack handler block 362.

It is also contemplated that the stack handler block may record the special stack status for each instance as an object within the structural behavioral description 358. In this embodiment, the structural behavioral description 358 is an object oriented database. Each instance within the structural behavioral description 358 may have a number of objects associated therewith. The stack handler block 362 may provide a stack identifier object to each instance that is associated with a stack. This may provide another way for the stack mode feature 368 of the placement block 364 to identify those instances that are associated with a particular stack.

As indicated above, the manual placement block 364 may read the structural behavioral description 358, and may be used to place selected objects prior to submitting the design to the auto-place and route block 370. The stack mode feature 368 may allow the manual placement block 364 to identify those instances that are associated with a selected stack. Thus, the placement tool of the present invention may understand the stack identifiers provided in the structural behavioral description 358, and may thus provide a more efficient way of manipulating and placing the instances associated therewith. For example, any cell manipulation operation that can be used to move, place, edit, etc. a single cell may also be used to place a stack. For example, an entire stack, including all instances associated therewith, may be placed, moved, unplaced, abutted, redrawn, aligned, connected, mirrored, etc., in a similar manner as a single cell may be manipulated.

For a vectored bus, a circuit designer may place all buffer elements of the vectored bus by simply executing a series of keystrokes. In a preferred embodiment, the circuit designer may identify a selected instance that is associated with a stack. This selection may not only select the selected instance, but may select all other subsequent instances associated with the corresponding stack (i.e. all instances having a suffix with a higher/lower bit number than the selected instance). The circuit designer may then specify a desired abutment spacing (spacing to be allotted between neighboring cells), and a placement location for the selected instance. Finally, the circuit designer may specify a placement direction (left, right, down, up, etc.) for subsequent cell placement. A single key-stroke may then cause the placement tool to automatically place, in a bit order fashion, all of the selected instances associated with the stack.

After manual placement, the circuit design may be provided to auto-place and route block 370, wherein the remainder of the circuit design may be placed, and the entire circuit design may be routed.

Figure 9:
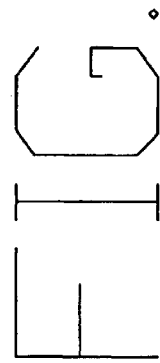
FIG. 9 is a table illustrating an object oriented data structure including a stack identifier object, in accordance with the present invention.

FIG. 9 is a table illustrating an object oriented data structure including a stack identifier object. As indicated above, the circuit design database may be object oriented. The database object may be identified by an instance name, for example, instance-A as shown. The database object may further include a number of variables that describe the instance. For example, instance-A may include a cell-type variable which indicates the type of the cell (NAND2, OR2, REG, etc.). Instance-A may further include a placement location, including the X-Y coordinates and the placement orientation. In addition, instance-A may include a cell size object, including the area of the region and the boundary definition. Further, instance-A may include a parent object pointer, which may indicate the parent of instance-A within the overall design hierarchy. Finally, instance-A may include a stack identifier, which may indicate the association of instance-A with a particular stack. The placement tool may use the stack identifier object to identify all instances that are associated with a particular stack. It should be understood that the objects shown in FIG. 9 is only illustrative, and that in a typical design database, many more details may be stored for each instance/object.

FIG. 10A is an example of a behavioral description for an integrated circuit. In this simple example, the signal named "A" is generated by a combination of "AND" and "OR" logical functions. The input signals are provided by "B", "C", "D", "E", "F", "G", "H", and "J". This behavioral description is then input to a logic design synthesis tool to produce a gate-level description. FIG. 10B is a gate-level representation synthesized from the behavioral description shown in FIG. 10A. The user-defined names "A", "B", "C", "D", "E", "F", "G", "H", and "J" are shown as input and output lines for the circuit. The logic design synthesis tool has generated multiple "AND" and "OR" gates to implement the behavioral description. These gates, and the interconnections between them, are given names by the logic design synthesis tool. In the example shown in FIG. 10B, all synthesis-generated names start with the letter "Z".

As discussed above, current logic design synthesis tools read a behavioral description and transform that description into a structural behavioral description. During the transformation process, the majority of components and nets are automatically generated by the logic design synthesis software. During the component and net generation process, the logic design synthesis tool will assign a unique name to each synthesis-generated component and net (i.e., those components and nets not explicitly defined by the circuit designer). Generally, the circuit designer has the ability to specify some minimal set of names within the behavioral description. A fundamental problem with prior art synthesis tools is their inability to associate components or nets with a group or stack. Rather, a pseudo-random name is generated for each component and net provided by the logic design synthesis tool, and no association is provided. Further, the instance names generated by the synthesis tool are generally not known with particularity.

FIG. 11A illustrates a behavioral equation representation of an illustrative vectored data path. In this example, the vectored net named "A(0–3)" is generated by a combination of "OR" logical functions. The input signals are provided by vectored nets "B(0–3)" and "C(0–3)". This behavioral description may be provided to a logic design synthesis tool to produce a gate-level description. FIG. 11B is a gate-level representation synthesized in accordance with the present invention from the behavioral description shown in FIG. 11A. The user-defined names "A(0)", "A(1)", "A(2)" and "A(3)" are shown as output lines for the circuit. Further, user defined names "B(0)", "B(1)", "B(2)", "B(3)" and "C(0)", "C(1)", "C(2) " and "C(3)" are shown as input lines for the circuit. The logic design synthesis tool has generated multiple "OR" gates to implement the behavioral description. In accordance with the present invention, these gates are given names by the logic design synthesis tool that indicate an association therebetween. That is, the prefix of the instance name for gates 400, 402, 404 and 406 are all, for example, "DA". The placement tool may identify all instances that have a common prefix, and may associate them as a stack. Further, the instance names for gates 400, 402, 404 and 406 are assigned a suffix that indicates the relative bit positions within the vectored datapath. For example, the instance name for gate 400 is assigned a suffix "00", indicating that gate 400 drives the "0" bit of the vectored datapath. Similarly, the instance name for gate 406 is assigned a suffix "03", indicating that gate 406 drives the "3" bit of the vectored datapath.

Finally, the logic design synthesis tool may record the special stack status of gates 400, 402, 404 and 406 in the circuit design database, preferably as an object associated with each instance. For example, gate 400 may include an object having a value DA00, as shown at 408.

The placement tool of the present invention may understand the stack identifiers provided in the circuit design database, and may thus more efficiently manipulate and place the instances associated therewith. For example, any cell manipulation operation that can be used to move, place, edit, etc. a single cell may also be used to place all instances associated with a stack. For example, an entire stack, including all instances associated therewith, may be placed, moved, unplaced, abutted, redrawn, aligned, connected, mirrored, etc., in a similar manner as a single cell may be manipulated.

In addition to the above, a circuit designer may place gates 400, 402, 404 and 406 by simply executing a number of keystrokes. In a preferred embodiment, the circuit designer may identify a selected instance that is associated with the stack, for example gate 400. This selection may not only select the selected instance, but may select all other subsequent instances associated with the corresponding stack (e.g. gates 402, 404 and 406). The circuit designer may then specify a desired abutment spacing (spacing to be allotted between neighboring cells), and a placement location for the selected instance. Finally, the circuit designer may specify a placement direction (left, right, down, up, etc.) for subsequent cell placement. A single key-stroke may then cause the placement tool to automatically place, in a bit order fashion, all of the selected instances 400, 402, 404 and 406.

Figure 12:
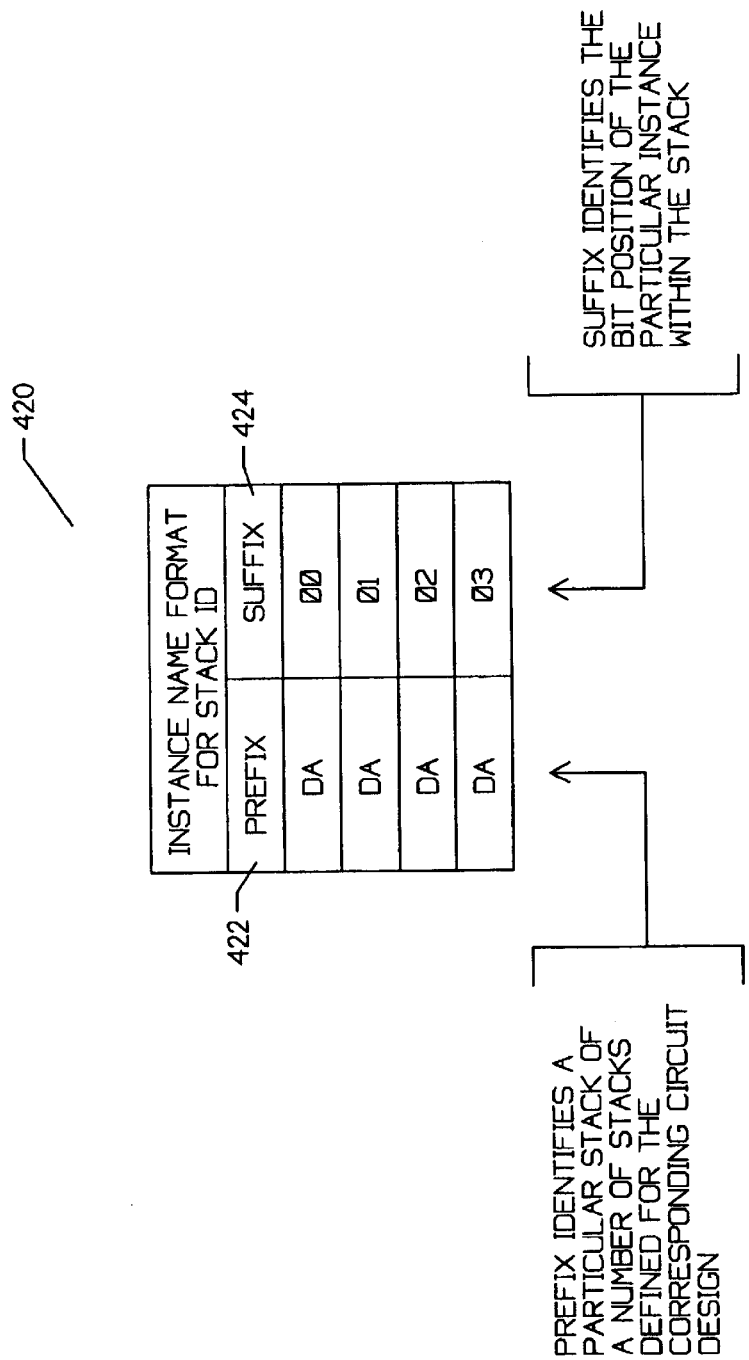
FIG. 12 is a table illustrating an exemplary instance name format provided by a synthesis tool for the vectored data path of FIG. 11B.

FIG. 12 is a table illustrating an exemplary instance name format provided by a synthesis tool for the vectored data path of FIG. 11B. The table is generally shown at 420. The first column 422 shows a common prefix that may be assigned to all instances associated with a stack. The second column 424 shows the suffix that may be assigned to each instance name, indicating the bit position of the particular instance within the stack. It should be recognized that this is only an exemplary instance name format, and may be used in conjunction with a vectored datapath. However, many other types of groups are contemplated, other than a grouping based on a vectored datapath. Any format that allows a placement tool to identify the particular instances that are associated with a stack are contemplated. In addition, the instances that are associated with a particular stack may be identified by a stack identifier object stored in the circuit design database, and not by a formatted instance name as described above.

Figure 13:
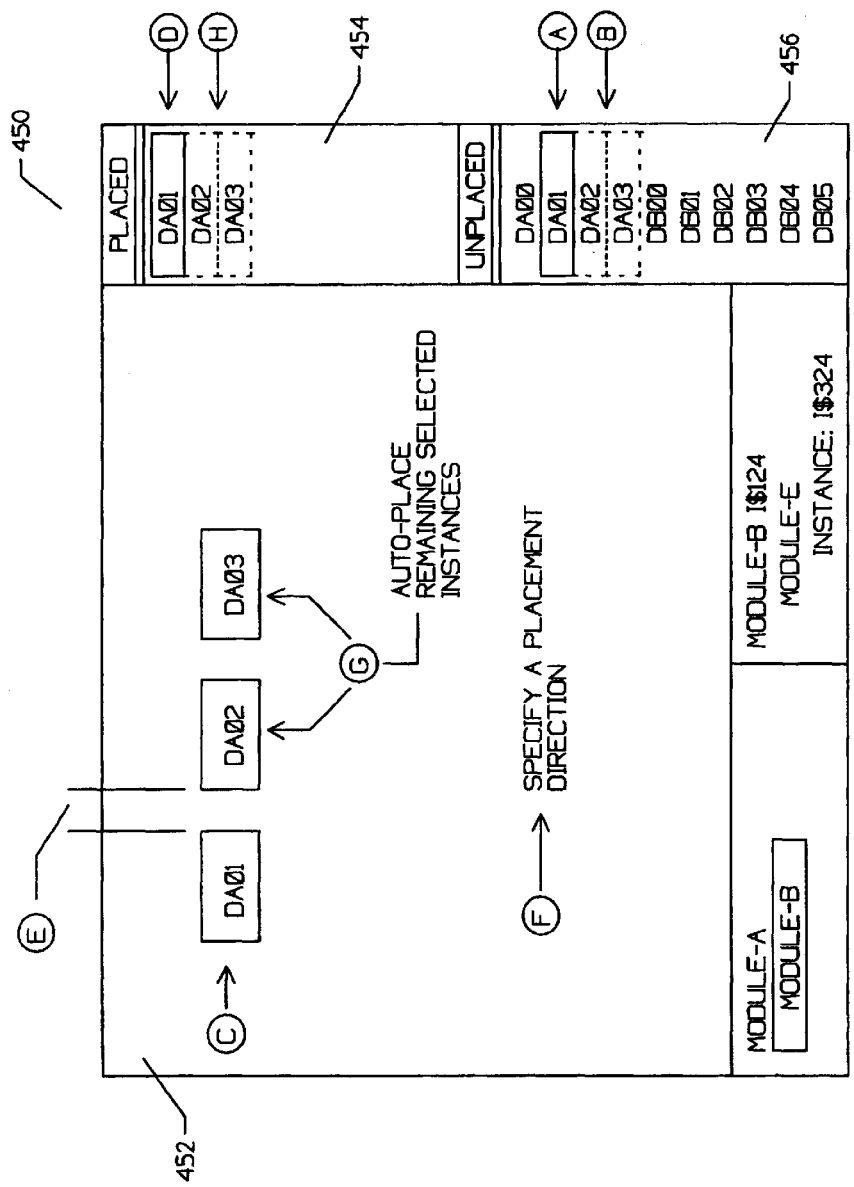
FIG. 13 is a block diagram illustrating an exemplary method for placing instances associated with a stack, and from within a placement tool.

FIG. 13 is a block diagram illustrating an exemplary method for placing instances associated with a stack, and from within a placement tool. The display provided by a placement tool in accordance with the present invention is generally shown at 450. As shown at "A", the circuit designer may first select a desired instance from the unplaced physical window 456. In this case, the circuit designer selected instance "DA01". The placement tool may recognize that instance "DA01" is associated with a stack, and that the stack includes instances "DA00", "DA01", "DA02" and "DA03". The placement tool may determine this by noting that the prefix of all of these instances are the same, namely "DA". Also, the placement tool may read a stack identifier object associated with each instance, if provided. In any event, and as shown at "B", the placement tool may then automatically select the remaining instances that are associated with the stack. In a preferred embodiment, however, only the instances that have bit positions at or above the selected instance are selected. Thus, in the example shown in FIG. 13, only "DA01", "DA02" and "DA03" are selected.

The circuit designer may then place the selected object "DA01", as shown at "C". The placement tool may then move the instance name "DA01" from the unplaced physical window 456 to the placed physical window 454. This is shown at "D". The circuit designer may then specify an abutment spacing, as shown at "E", and a placement direction, as shown at "F". Then, by striking a number of pre-defined hot-keys, the remaining instances that are selected may be automatically placed by the placement tool, in the placement direction and spaced in accordance with the abutment spacing. This is shown at "G". Finally, and as shown at "H", the placement tool may move the automatically placed instances from the unplaced physical window 456 to the placed physical window 454.

Figure 14:
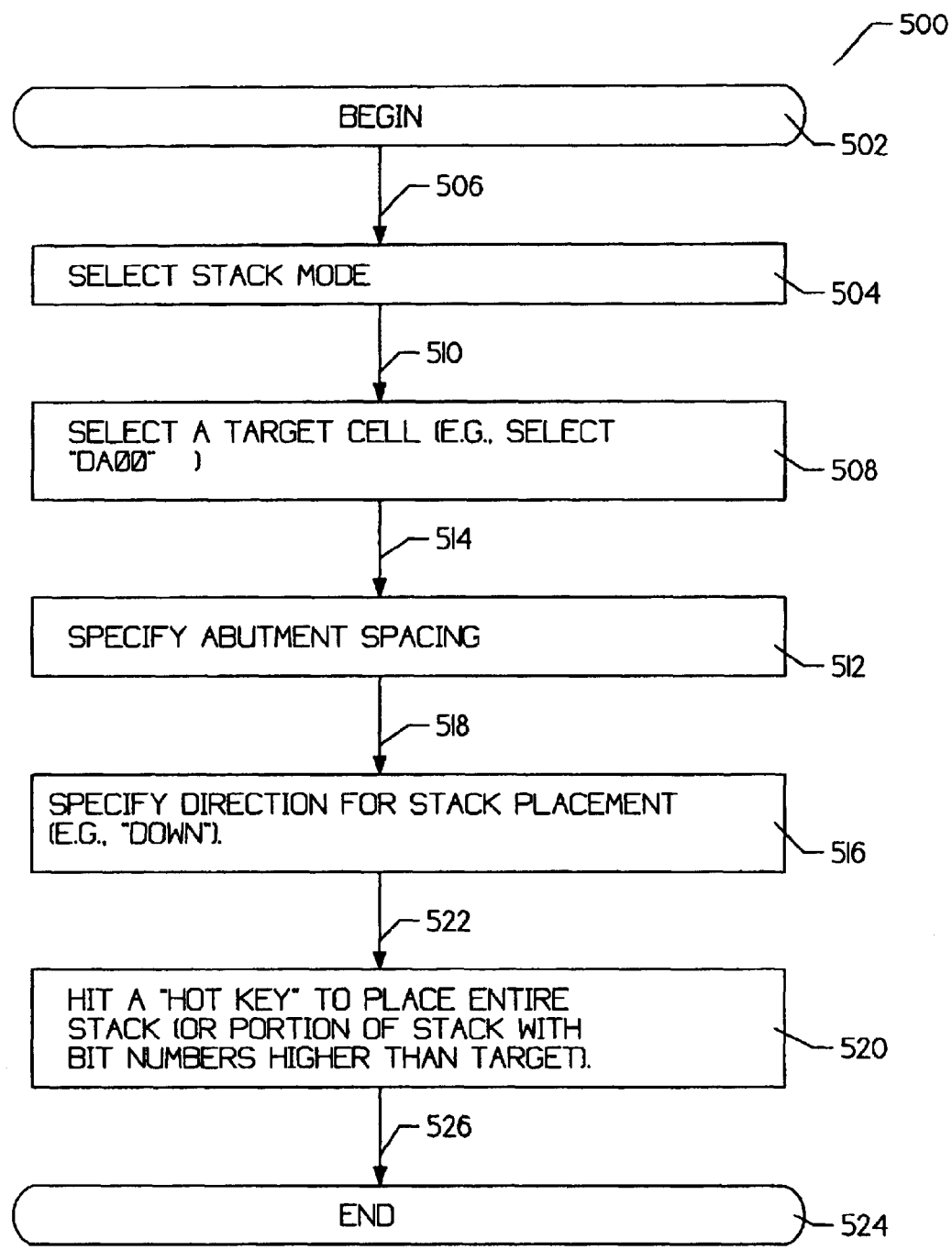
FIG. 14 is a flow diagram showing an exemplary method for placing instances associated with a stack, and from within a placement tool.

FIG. 14 is a flow diagram showing an exemplary method for placing instances that are associated with a stack. The algorithm is generally shown at 500, and is entered at element 502. Control is passed to element 504 via interface 506. Element 504 sets a placement tool into a stack mode. The stack mode may indicate to the placement tool that stack operations are allowed. Control is then passed to element 508 via interface 510. Element 508 selects a target cell, wherein the target cell is within a stack. Control is then passed to element 512 via interface 514. Element 512 specifies an abutment spacing. Control is then passed to element 516 via interface 518. Element 516 specifies a placement direction. Control is then passed to element 520 via interface 522. Element 520 places the entire stack, including all or a portion of the instances associated with the stack, in accordance with the abutment spacing specified in element 512, and the placement direction specified in element 516. Control is then passed to element 524 via interface 526, wherein the algorithm is exited.

Figure 15:
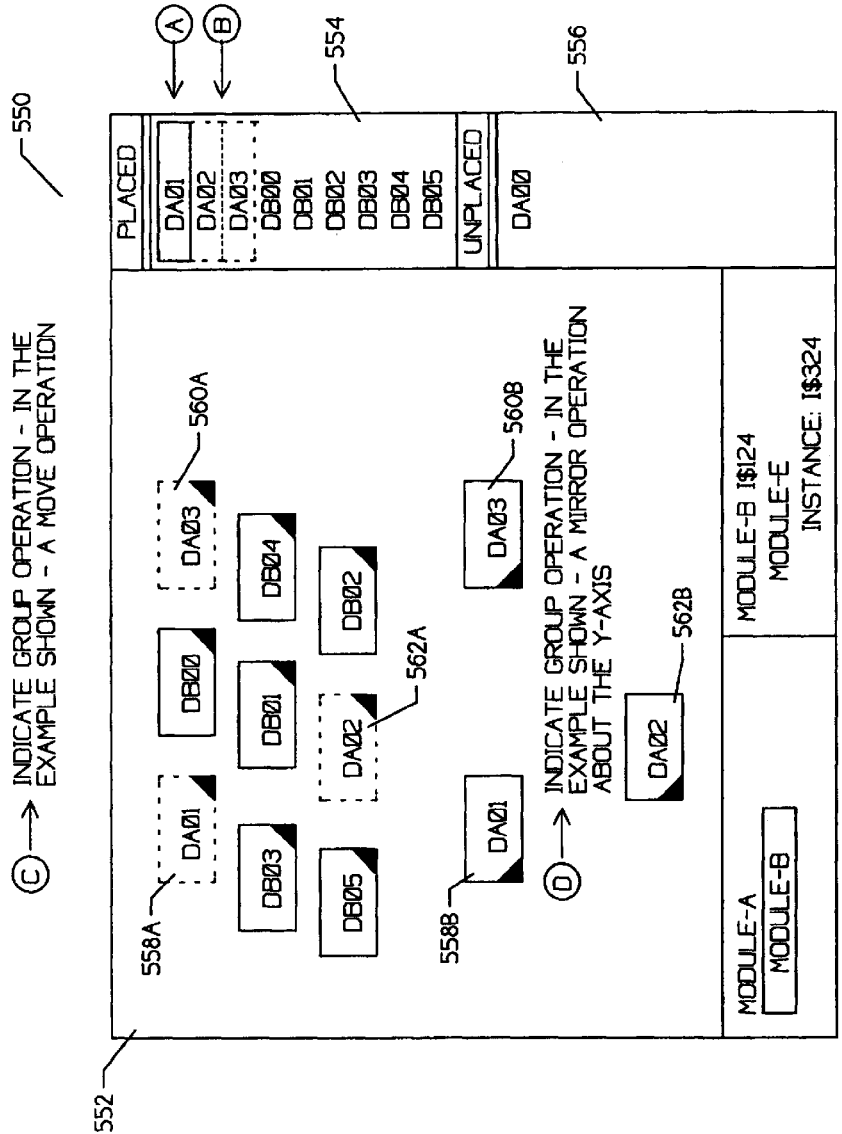
FIG. 15 is a block diagram illustrating an exemplary method for performing a move operation followed by a mirror operation of selected instances associated with a stack.

FIG. 15 is a block diagram illustrating an exemplary method for performing a move operation followed by a mirror operation of instances associated with a stack. The display provided by a placement tool in accordance with the present invention is generally shown at 550. To accomplish an editing function, and as shown at "A", the circuit designer may first select a desired instance from the placed physical window 554. In this case, the circuit designer selected instance "DA01". Alternatively, the circuit designer may select a desired instance from the floorplanning window using a conventional pointing device. In either case, the placement tool may recognize that instance "DA01" is associated with a stack, and that the stack includes instances "DA00", "DA01", "DA02" and "DA03". The placement tool may determine this by noting that the prefix of all of these instances are the same, namely "DA". Also, the placement tool may read a stack identifier object associated with each instance, if provided. In any event, and as shown at "B", the placement tool may then automatically select the remaining instances that are associated with the stack. In a preferred embodiment, however, only the instances that are positioned at or above the selected instance are selected. Thus, in the example shown in FIG. 15, only "DA01", "DA02" and "DA03" are selected.

Once selected, the circuit designer may manipulate the instances in a conventional manner. That is, the circuit designer may perform a move operation as shown at step "C". Accordingly, DA01 558A, DA02 562A and DA03 560A may be moved downward, and may be ultimately placed as shown at 558B, 562B and 560B, respectively.

Thereafter, and as shown at step "D", the circuit designer may perform, for example, a mirror operation of all selected cells. During a mirror operation, and in a preferred embodiment, the orientation of each individual cell may be mirrored about a selected axis, but the location of the cells may not be changed. In the illustrative embodiment, the orientation of cells 558B, 560B and 562B are individually mirrored about the Y-axis as shown, but the location of each cell is not changed. It is contemplated, however, that a group mirror operation may be performed wherein the orientation and location of each individual cell may be changed.

Figure 16:
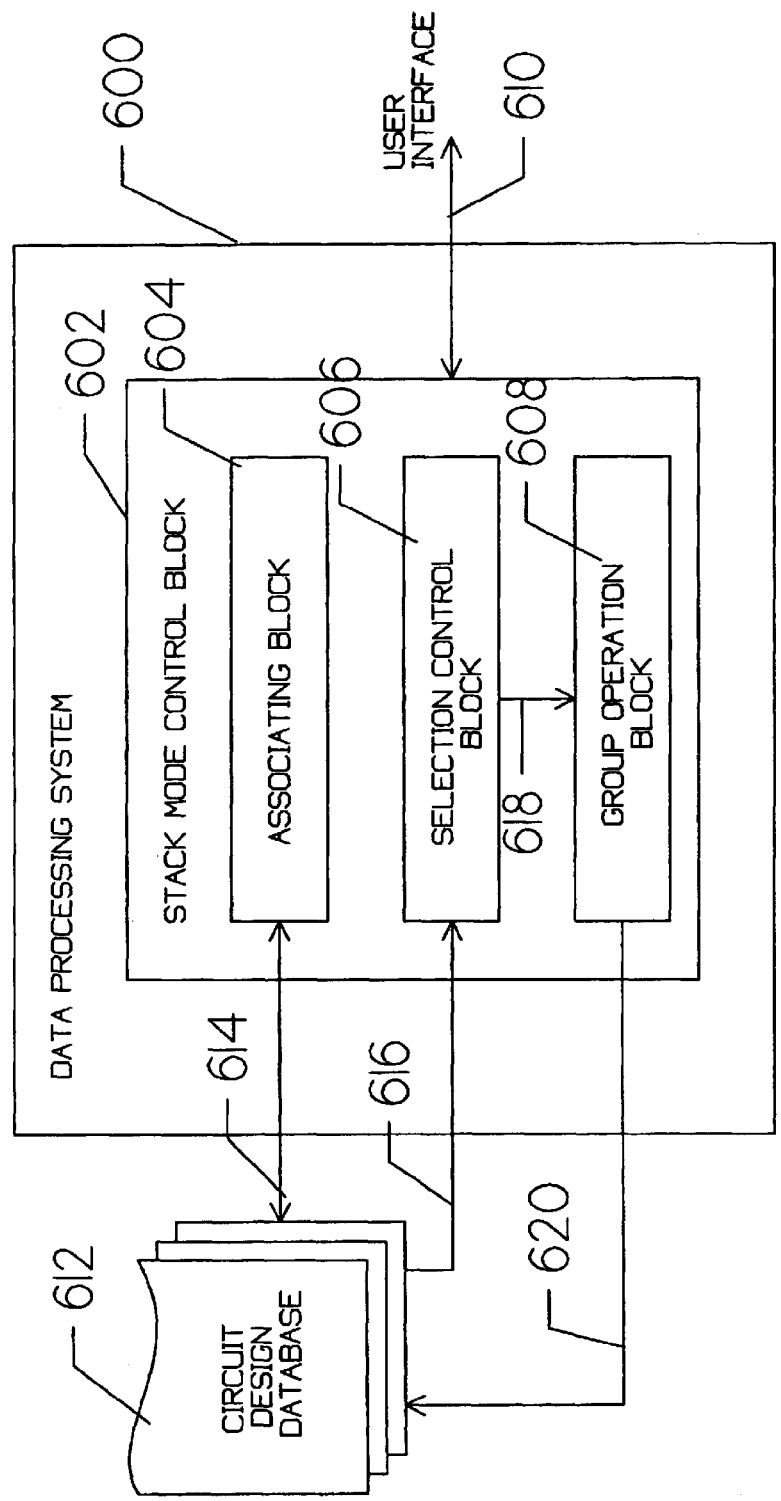
FIG. 16 is a block diagram of a data processing system in accordance with the present invention.

FIG. 16 is a block diagram of a data processing system in accordance with the present invention. The data processing system is generally shown at 600, and may include a stack mode control block 602. The stack mode control block may include an associating block 604, a selection control block 606 and a group operation block 608. The associating block 604 may read a circuit design database 612 via interface 614. The associating block 604 may then associate selected instances with one another, wherein the resulting group is called a stack. The association between the instances may be recorded in the circuit design database 612 via interface 614.

Thereafter, the selection control block 606 may select an instance associated with a stack. The selection may be controlled, at least in part, by a circuit designer via user interface 610. The selection control block may then select all or some of the other instances associated with the stack.

The group operation block 608 may then perform a group operation on all selected instances, and may store the results in circuit design database 612 via interface 620. The group operation block 608 may be controlled, at least in part, by a circuit designer via interface 610.

Having thus described the preferred embodiments of the present invention, those of skill in the art will readily appreciate that the teachings found herein may be applied to yet other embodiments within the scope of the claims hereto attached.

We claim:

1. A method for selectively associating a number of instances of a circuit design database, the method comprising the step of:
   a. associating the number of instances with a predefined instance grouping called a stack by associating a selected stack identifier with each of the number of instances, wherein the selected stack identifier is stored in the circuit design database, and identifies each of the number of instances as corresponding to the stack;
   b. selecting selected ones of the instances that correspond to the stack; and
   c. performing a selected group operation on selected ones of the instances that correspond to the stack.

2. A method according to claim 1 wherein each of the number of instances has a corresponding instance name associated therewith, wherein each of the number of instance names are stored in the circuit design database.

3. A method according to claim 2 wherein said selected stack identifier for each of the number of instances is a selected portion of the corresponding instance name, wherein the selected portion of the instance name associates each of the number of instances with the stack.

4. A method according to claim 3 wherein the circuit design database includes a pre-synthesis database including a number of logical equations, and a post-synthesis database including at least the number of instances, wherein a synthesis tool implements the logical equations of the pre-synthesis database thereby resulting in at least the number of instances in the post-synthesis database.

5. A method according to claim 4 wherein a selected logical equation of the pre-synthesis database implements a vectored datapath function, and wherein the synthesis tool implements the selected logical equation using a number of selected instances.

6. A method according to claim 5 wherein said synthesis tool assigns instance names to the selected instances, such that the instance names identify each of the selected instances as corresponding to the stack.

7. A method according to claim 6 wherein the instance names assigned by the synthesis tool include a prefix portion and a suffix portion, wherein the prefix portion of the instance names identify each of the selected instances as corresponding to the stack.

8. A method according to claim 7 wherein the suffix portion of the instance names identifies a bit position of the corresponding instance within the vectored datapath function.

9. A method according to claim 8 wherein said selecting step includes the step of selecting any one of the instances corresponding to the stack, thereby resulting in a selected one of the number of instances.

10. A method according to claim 9 wherein the selected one of the number of instances has a selected bit position, and wherein predetermined ones of the instances have a bit position that is higher than the selected bit position and predetermined ones of the instances have a bit position that is lower than the selected bit position.

11. A method according to claim 10 wherein said selecting step further includes automatically selecting those instances having a bit position that is equal to or higher than the selected bit position.

12. A method according to claim 10 wherein said selecting step further includes automatically selecting those instances having a bit position that is equal to or lower than the selected bit position.

13. A method according to claim 1 wherein said selecting step includes the step of selecting any one of the instances corresponding to the stack.

14. A method according to claim 1 wherein the group operation includes a placing operation, wherein the placing operation places the selected instances at a desired location.

15. A method according to claim 14 wherein the placing operation includes the steps of:
   a. selecting a first one of the number of selected instances;
   b. placing the first one of the selected instances at a first desired location;
   c. specifying a placement direction;
   d. autoplacing the remainder of the selected instances extending from the first one of the number of selected instances, with a predetermined spacing therebetween, and in the placement direction.

16. A method according to claim 15 wherein said autoplacing step is initiated by depressing a predefined hot key.

17. A method according to claim 15 further comprising the step of specifying the predetermined spacing.

18. A method according to claim 1 wherein the group operation includes un-placing the selected instances.

19. A method according to claim 1 wherein the group operation includes moving the selected instances from a first location to a second location.

20. A method according to claim 1 wherein the group operation includes abutting the selected instances with one-another.

21. A method according to claim 1 wherein the group operation includes re-drawing the selected instances on a display device.

22. A method according to claim 1 wherein the group operation includes aligning the selected instances with a selected object in the circuit design database.

23. A method according to claim 1 wherein the group operation includes mirroring the selected instances about a predetermined axis.

24. A data processing system for selectively associating a number of instances of a circuit design database, comprising:

a. an associating block for associating a number of instances with a predefined instance grouping called a stack by associating a selected stack identifier with each of the number of instances, wherein the selected stack identifier is stored in the circuit design database, and identifies each of the number of instances as corresponding to the stack;

b. a selecting block coupled for selecting selected ones of the instances that correspond to the stack; and c. a performing block coupled to said selecting block for performing a selected group operation on selected ones of the instances that correspond to the stack.

25. A data processing system according to claim 24 wherein each of the number of instances has a corresponding instance name associated therewith, wherein each of the number of instance names are stored in the circuit design database.

26. A data processing system according to claim 25 wherein said selected stack identifier for each of the number of instances is a selected portion of the corresponding instance name, wherein the selected portion of the instance name associates each of the number of instances with the stack.

* * * * *